US012622010B2

(12) United States Patent
Kumazaki et al.

(10) Patent No.: US 12,622,010 B2
(45) Date of Patent: May 5, 2026

(54) SEMICONDUCTOR DEVICE AND METHOD FOR MANUFACTURING SEMICONDUCTOR DEVICE

(71) Applicant: 1FINITY Inc., Kawasaki (JP)

(72) Inventors: Yusuke Kumazaki, Atsugi (JP); Naoki Hara, Sagamihara (JP); Naoya Okamoto, Isehara (JP); Shirou Ozaki, Yamato (JP); Toshihiro Ohki, Hadano (JP)

(73) Assignee: 1FINITY Inc., Kawasaki (JP)

( * ) Notice: Subject to any disclaimer, the term of this patent is extended or adjusted under 35 U.S.C. 154(b) by 599 days.

(21) Appl. No.: 17/820,705

(22) Filed: Aug. 18, 2022

(65) Prior Publication Data

US 2023/0163206 A1      May 25, 2023

(30) Foreign Application Priority Data

Nov. 24, 2021    (JP) .................................. 2021-189997

(51) Int. Cl.
| | |
|---|---|
| *H10D 30/47* | (2025.01) |
| *H10D 30/01* | (2025.01) |
| *H10D 64/01* | (2025.01) |
| *H10D 64/23* | (2025.01) |
| *H10D 64/27* | (2025.01) |

(52) U.S. Cl.
CPC ......... *H10D 30/475* (2025.01); *H10D 30/015* (2025.01); *H10D 64/01* (2025.01); *H10D 64/251* (2025.01); *H10D 64/411* (2025.01)

(58) Field of Classification Search
CPC .... H10D 30/475; H10D 30/015; H10D 64/01; H10D 64/251; H10D 64/411
See application file for complete search history.

(56) References Cited

U.S. PATENT DOCUMENTS

| | | | |
|---|---|---|---|
| 2008/0217625 A1* | 9/2008 | Kuroda ................ | H10D 62/405 438/479 |
| 2016/0071939 A1* | 3/2016 | Matsushita .......... | H10D 30/015 257/192 |

FOREIGN PATENT DOCUMENTS

| | | |
|---|---|---|
| JP | 2008-227014 A | 9/2008 |
| JP | 2015-133407 A | 7/2015 |

OTHER PUBLICATIONS

Office Action of Japanese Patent Application No. 2021-189997 dated Jul. 29, 2025, with Machine Translation.

* cited by examiner

*Primary Examiner* — Brigitte A Paterson
(74) *Attorney, Agent, or Firm* — Arent Fox Schiff LLP

(57) ABSTRACT

A semiconductor device includes: a substrate; an electron traveling layer provided above the substrate; an electron supply layer provided above the electron traveling layer; gate, source and drain electrodes provided above the electron supply layer; first protrusions that extend from a lower end of the source electrode through an inside of the electron supply layer to below an upper surface of the electron traveling layer; and second protrusions that extend from a lower end of the drain electrode through the inside of the electron supply layer to below the upper surface of the electron traveling layer, wherein a first volume ratio of the first protrusions in a first area where the first protrusions is provided is 60% or less, and a second volume ratio of the second protrusions in a second area where the second protrusions is provided is 60% or less.

11 Claims, 32 Drawing Sheets

100

100

X1

150G

150S

170

160SA

140

160S

130

120

120A 140
130
120A
120
111
110

CURRENT DIRECTION

Z
X
Y 140
130
120A
120

CURRENT DIRECTION

Z
Y
X

⊛ CURRENT DIRECTION

⊛ CURRENT DIRECTION

CURRENT DIRECTION

CURRENT
DIRECTION   160SA

100A 150S
140
130
120A
120
160S

165     CURRENT DIRECTION     160SA 140P
140
130
120A
120

⊙ CURRENT DIRECTION

⊚ CURRENT DIRECTION

CURRENT DIRECTION

CURRENT DIRECTION

CURRENT DIRECTION 170C
140
130
120A
120
111
110

← CURRENT DIRECTION

Z
Y ⊗ → X 170C
140
130
120A
120

⊙ CURRENT DIRECTION

Z
Y ← ⊗ X

CURRENT DIRECTION

CURRENT DIRECTION 10C
170C
140
130
120A
120

⊚ CURRENT DIRECTION

⊙ CURRENT DIRECTION 150S
170C
140
130
120A
120
160S

160SA     ⊙ CURRENT DIRECTION

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority of the prior Japanese Patent Application No. 2021-189997, filed on Nov. 24, 2021, the entire contents of which are incorporated herein by reference.

FIELD

The embodiments discussed herein are related to a semiconductor device and a method for manufacturing a semiconductor device.

BACKGROUND

Conventionally, there is a nitride semiconductor device including a nitride semiconductor layer and an ohmic electrode in contact with a side surface of the nitride semiconductor layer, the side surface being a non-polar surface. Unevenness is formed in a surface of the nitride semiconductor layer, and the side surface is a side surface of a recess. The recesses are arranged in a checkered pattern or a stripe shape on the surface of the nitride semiconductor layer.

Japanese Laid-open Patent Publication No. 2008-227014 is disclosed as related art.

SUMMARY

According to an aspect of the embodiments, a semiconductor device includes: a substrate; an electron traveling layer provided above the substrate; an electron supply layer provided above the electron traveling layer; a gate electrode, a source electrode, and a drain electrode provided above the electron supply layer; a plurality of first protrusions that extend from a lower end of the source electrode through an inside of the electron supply layer to below an upper surface of the electron traveling layer, and that are formed of electrode material of the source electrode; and a plurality of second protrusions that extend from a lower end of the drain electrode through the inside of the electron supply layer to below the upper surface of the electron traveling layer, and that are formed of electrode material of the drain electrode, wherein a first volume ratio of the plurality of first protrusions in a first area where the plurality of first protrusions is provided is 60% or less, and a second volume ratio of the plurality of second protrusions in a second area where the plurality of second protrusions is provided is 60% or less.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1A:
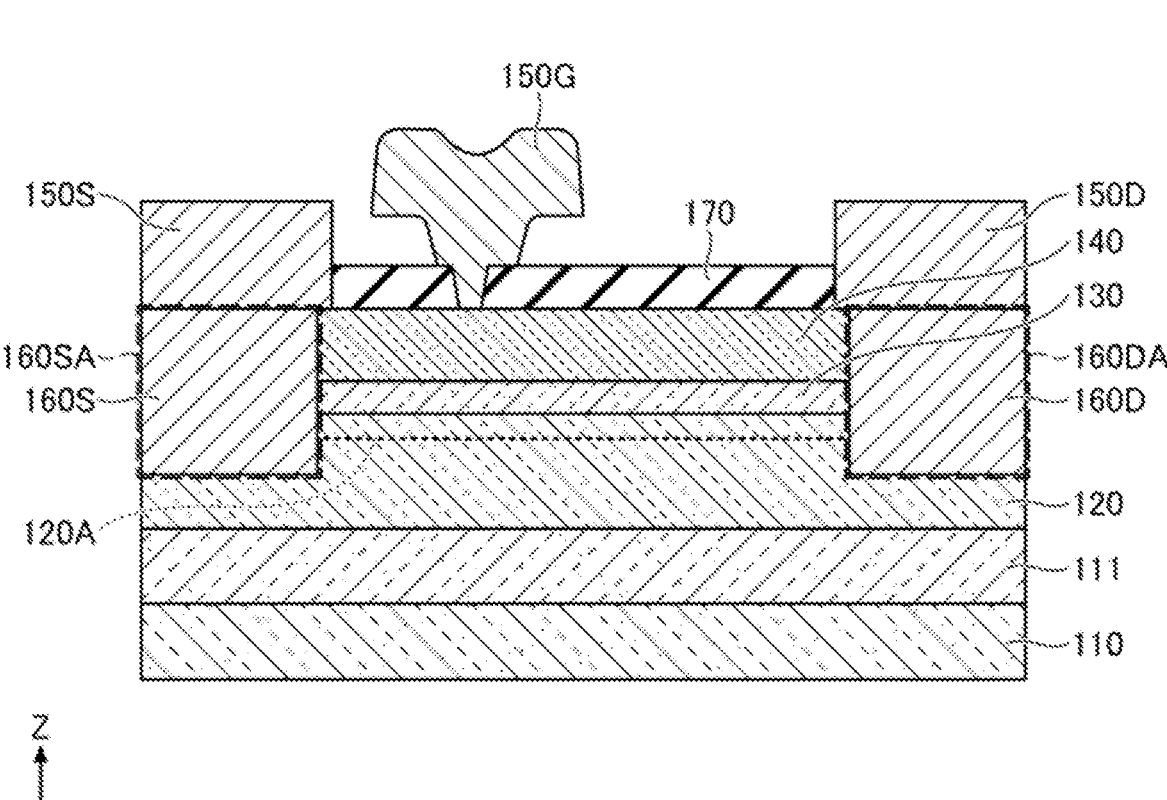
FIG. 1A is a view illustrating a cross-sectional structure of a semiconductor device 100 of a first embodiment.
Figure 1A:
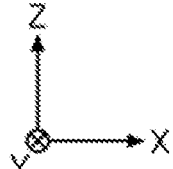

By the way, regarding the existing nitride semiconductor device, there is no disclosure regarding a volume ratio of the ohmic electrode in an area where the recess is formed. The volume ratio affects a contact resistance between a source electrode and a drain electrode, and the semiconductor layer.

Therefore, an object is to provide a semiconductor device and a method for manufacturing the semiconductor device capable of reducing a contact resistance.

Hereinafter, embodiments to which a semiconductor device and a method for manufacturing the semiconductor device of the present disclosures are applied will be described. Hereinafter, components having substantially the same functional configuration are denoted by the same reference numerals, and redundant description may be omitted.

First Embodiment

Figure 1B:
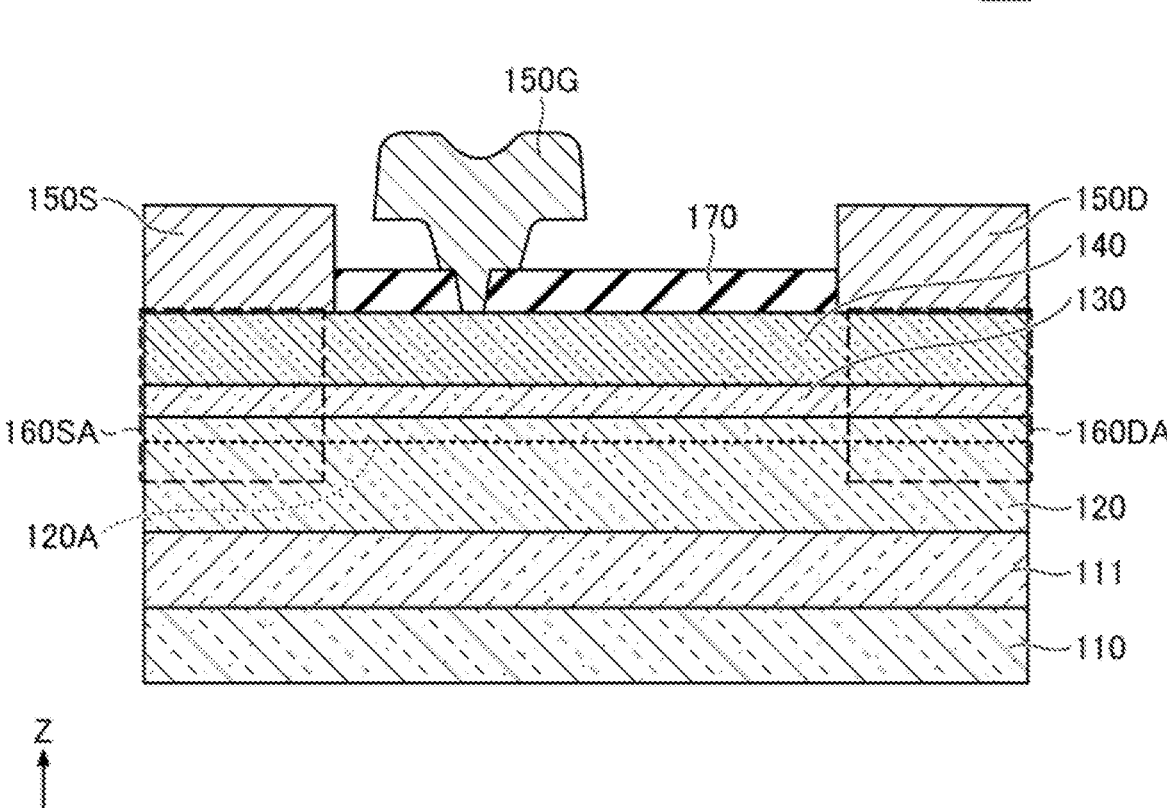
FIG. 1B is a view illustrating a cross-sectional structure of the semiconductor device 100 of the first embodiment.
Figure 1B:
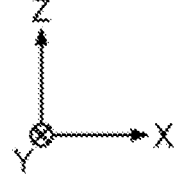
Figure 2A:
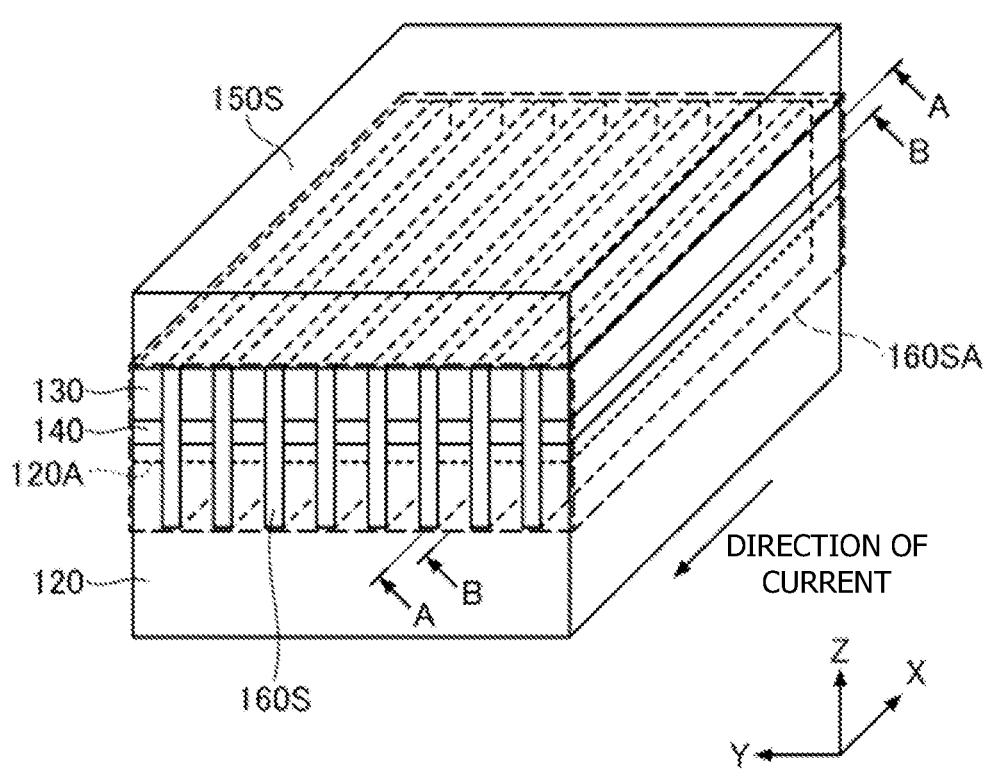
FIG. 2A is an enlarged perspective view illustrating a part of an inside of the semiconductor device 100.
Figure 2B:
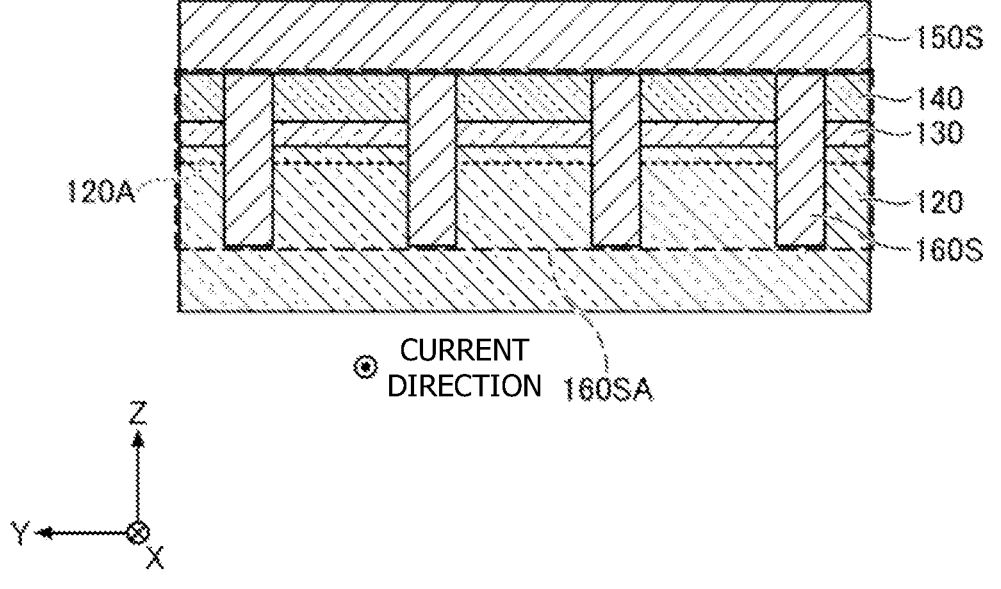
FIG. 2B is a view illustrating a cross-sectional structure of a part of the semiconductor device 100.

FIGS. 1A and 1B are views illustrating a cross-sectional structure of a semiconductor device 100 of a first embodi-ment. FIG. 2A is an enlarged perspective view illustrating a part of an inside of the semiconductor device 100. FIG. 2B is a view illustrating a cross-sectional structure of a part of the semiconductor device 100. FIG. 1A is a cross section parallel to an entire XZ plane of the semiconductor device 100, and illustrates a cross section corresponding to the cross section taken along line A-A in FIG. 2A. FIG. 1B is a cross section parallel to the entire XZ plane of the semiconductor device 100, and illustrates a cross section corresponding to the cross section taken along line B-B in FIG. 2A. Further-more, since FIG. 2A is a part of an inside of the semicon-ductor device 100, FIG. 2A includes a cross section parallel to the YZ plane on −X direction side and a cross section parallel to the XZ plane on −Y direction side. To illustrate a structure in an easy-to-see manner, hatching is omitted. Furthermore, FIG. 2B is a cross-sectional view illustrating a portion corresponding to a part of a width in a Y direction of the semiconductor device 100, the portion being further enlarged as compared with the portion in FIG. 2A. Hatching is given to FIG. 2B.

Hereinafter, description will be given, defining an XYZ coordinate system. A direction parallel to an X axis (X direction), a direction parallel to a Y axis (Y direction), and a direction parallel to a Z axis (Z direction) are orthogonal to each other. The X direction is an example of a first direction, and the Y direction is an example of a second direction. Furthermore, hereinafter, for convenience of the description, the −Z direction side may be referred to as a lower side or below, and the +Z direction side may be referred to as an upper side or above. However, these references do not represent a universal upper-lower relation-ship. Plan view means to view an XY plane. Hereinafter, length, width, thickness, and the like of each part may be exaggerated so that the configuration can be easily under-stood.

Configuration of Semiconductor Device 100

The semiconductor device 100 includes a substrate 110, an initial layer 111, an electron traveling layer 120, a spacer layer 130, an electron supply layer 140, a gate electrode 150G, a source electrode 150S, a drain electrode 150D, a protrusion 160S, a protrusion 160D, and a passivation film 170. The protrusion 160S is an example of a first protrusion, and the protrusion 160D is an example of a second protru-sion.

The semiconductor device 100 is a GaN-based high electron mobility transistor (HEMT) in which the electron traveling layer 120 is formed of gallium nitride (i-GaN) without intentional doping of impurities and the electron supply layer 140 is formed of aluminum gallium nitride (AlGaN) or the like. Note that the electron supply layer 140 is not limited to AlGaN, and details will be described below.

Configuration of Substrate 110

As the substrate 110, for example, a substrate of silicon carbide (SiC), silicon (Si), sapphire, gallium nitride (GaN), aluminum nitride (AlN), diamond, or the like can be used.

Configuration of Initial Layer 111

The initial layer 111 is provided on an upper surface of the substrate 110. A nitride semiconductor is used for the initial layer 111, and for example, AlN, GaN, AlGaN or a laminated structure thereof is used. The initial layer 111 is a nitride semiconductor layer that may be treated as a buffer layer, a strain relaxation layer, or a defect reduction layer.

Configuration of Electron Traveling Layer 120

The electron traveling layer 120 is a nitride semiconduc-tor layer provided on an upper surface of the initial layer 111 and formed of i-GaN as an example. The electron traveling layer 120 is a layer on which a channel is formed. In the vicinity of an interface between the electron traveling layer 120 and the spacer layer 130, a two-dimensional electron gas (2DEG) 120A is generated by an action of piezoelectric polarization or spontaneous polarization in i-GaN. A posi-tion of the 2DEG 120A is indicated by the broken line. A direction in which a current flows in the electron traveling layer 120 is the −X direction.

Configuration of Spacer Layer 130

The spacer layer 130 is provided on an upper surface of the electron traveling layer 120, and is, for example, a nitride semiconductor layer formed of AlN or AlGaN. The spacer layer 130 is provided to suppress deterioration of electron mobility due to alloy scattering in the electron traveling layer 120 and to enable a large current. An interface between the spacer layer 130 and the electron traveling layer 120 is an interface between the channel and the spacer layer 130.

Configuration of Electron Supply Layer 140

The electron supply layer 140 is provided on an upper surface of the spacer layer 130, and is a nitride semiconductor layer formed of, for example, aluminum gallium nitride (AlGaN), indium aluminum nitride (InAlN), indium aluminum gallium nitride (InAlGaN), aluminum nitride (AlN), or scandium aluminum nitride (ScAlN). By arranging the electron supply layer 140 and the electron traveling layer 120 via the spacer layer 130, the 2DEG 120A is generated in the vicinity of the interface between the electron traveling layer 120 and the spacer layer 130. A composition ratio of Al in the electron supply layer 140 is favorably 45% or more from the viewpoint of increasing an electron concentration. In the case of using such an electron supply layer 140 having a high Al composition ratio, it is favorable to provide the spacer layer 130.

Configuration of Gate Electrode 150G

The gate electrode 150G is arranged so as to be connected to the electron supply layer 140 from above the passivation film 170 through a through hole penetrating the passivation film 170. The gate electrode 150G is made of, for example, a laminated film of nickel (Ni) as a first layer and gold (Au) as a second layer laminated on the first layer. As an example, the laminated film has Ni of 5 nm to 30 nm and Au of 100 nm to 300 nm.

Configuration of Source Electrode 150S

The source electrode 150S is provided on an upper surface of the electron supply layer 140 on the −X direction side of the gate electrode 150G. The source electrode 150S is made of, for example, a laminated film of titanium (Ti) as a first layer and Al as a second layer laminated on the first layer. As an example, the laminated film has Ti of 2 nm to 50 nm and Al of 100 nm to 300 nm.

Configuration of Drain Electrode 150D

The drain electrode 150D is provided on an upper surface of the electron supply layer 140 on the +X direction side of the gate electrode 150G. Similar to the source electrode 150S, the drain electrode 150D is made of, for example, a laminated film of titanium (Ti) as a first layer and Al as a second layer laminated on the first layer. As an example, the laminated film has Ti of 2 nm to 50 nm and Al of 100 nm to 300 nm.

Configuration of Protrusion 160S and Area 160SA

The protrusion 160S extends from a lower surface (lower end) of the source electrode 150S through an inside of the electron supply layer 140 and the spacer layer 130 to below the upper surface of the electron traveling layer 120, and is formed of an electrode material of the source electrode 150S. The protrusion 160S is provided to improve an ohmic contact of the source electrode 150S.

A plurality of the protrusions 160S is provided, and the plurality of protrusions 160S is a plurality of thin plate-shaped protrusions extending in the X direction connecting the source electrode 150S and the drain electrode 150D in plan view and arrayed in the Y direction in plan view. Each of the plurality of protrusions 160S is a thin plate-shaped protrusion extending in the X direction and parallel to the XZ plane. The protrusion 160S extending in the X direction means that a longitudinal direction of the protrusion 160S is the X direction in plan view. The plurality of protrusions 160S is a plurality of thin wall portions, and is arranged like a plurality of fins protruding downward from the lower surface of the source electrode 150S. The protrusions 160S are formed as a plurality of thin wall portions protruding downward from the lower surface of the source electrode 150S in order to increase a contact area with the electron supply layer 140, the spacer layer 130, and the electron traveling layer 120 to obtain favorable ohmic contact. Note that, as an example, the length in the X direction of the protrusion 160S is equal to the length in the longitudinal direction of the protrusion 160D.

Note that a part of the semiconductor device 100 enlarged and illustrated in FIG. 2A is a part above a lower surface of the electron traveling layer 120 and corresponding to a part of the width in the Y direction of the source electrode 150S. For example, FIG. 2A illustrates a part of the plurality of protrusions 160S arranged in the Y direction. Such a configuration is similar for the protrusion 160D located below the drain electrode 150D.

Here, an area where the plurality of protrusions 160S is provided on a lower side of the source electrode 150S is referred to as an area 160SA. The area 160SA is an example of a first area. The area 160SA includes the plurality of protrusions 160S and the nitride semiconductor layers of the electron traveling layer 120, the spacer layer 130, and the electron supply layer 140 provided between the plurality of protrusions 160S. The area 160SA has, for example, a size equal to the source electrode 150S in plan view and a size equal to the protrusion 160S in XZ plane view.

Note that in a case where the protrusion 160S at an end on the +Y direction side is offset in the −Y direction with respect to an end portion on the +Y direction side of the source electrode 150S, an end portion in the +Y direction of the area 160SA may be a side surface in the +Y direction (a side surface parallel to the XZ plane) of the protrusion 160S at the end on the +Y direction side. Similarly, in a case where the protrusion 160S at an end on the −Y direction side is offset in the +Y direction with respect to an end portion on the −Y direction side of the source electrode 150S, an end portion in the −Y direction of the area 160SA may be a side surface in the −Y direction (a side surface parallel to the XZ plane) of the protrusion 160S at the end on the −Y direction side. Here, as an example, description will be given on the assumption that the area 160SA has a size equal to the source electrode 150S in plan view.

FIG. 1A, which is a cross section taken along line A-A in FIG. 2A, is a cross section including the protrusion 160S, and FIG. 1B, which is a cross section taken along line B-B in FIG. 2A, is a cross section not including the protrusion 160S. Therefore, FIG. 1A illustrates the protrusion 160S and the area 160SA. In FIG. 1A, the area 160SA is slightly enlarged and illustrated outside a contour of the protrusion 160S, but the sizes of the area 160SA and the protrusion 160S in the XZ plane are the same. Furthermore, FIG. 1B also illustrates the area 160SA.

Since such a plurality of protrusions 160S extends to below the upper surface of the electron traveling layer 120, the protrusions 160S are in contact with the 2DEG 120A. Furthermore, the 2DEG 120A also occurs in a portion of the electron traveling layer 120, the portion being included in the area 160SA.

Configuration of Protrusion 160D and Area 160DA

The protrusion 160D extends from a lower surface (lower end) of the drain electrode 150D through an inside of the electron supply layer 140 and the spacer layer 130 to below the upper surface of the electron traveling layer 120, and is formed of an electrode material of the drain electrode 150D. A plurality of the protrusions 160D is provided, and the plurality of protrusions 160D is a plurality of thin plate-shaped protrusions extending in the X direction and arrayed in the Y direction in plan view. Each of the plurality of protrusions 160D is a thin plate-shaped protrusion extending in the X direction and parallel to the XZ plane. The protrusion 160D extending in the X direction means that a longitudinal direction of the protrusion 160D is the X direction in plan view. The plurality of protrusions 160D is a plurality of thin wall portions similar to the plurality of protrusions 160S, and is arranged like a plurality of fins protruding downward from the lower surface of the drain electrode 150D. The protrusions 160D are formed as a plurality of thin wall portions protruding downward from the lower surface of the drain electrode 150D in order to increase a contact area with the electron supply layer 140, the spacer layer 130, and the electron traveling layer 120 to obtain favorable ohmic contact. As an example, the length in the X direction of the protrusion 160D is equal to the length in the longitudinal direction of the protrusion 160S.

Here, an area where the plurality of protrusions 160D is provided on a lower side of the drain electrode 150D is referred to as an area 160DA. The area 160DA is an example of a second area. The area 160DA includes the plurality of protrusions 160D and the nitride semiconductor layers of the electron traveling layer 120, the spacer layer 130, and the electron supply layer 140 provided between the plurality of protrusions 160D. The area 160DA has, for example, a size equal to the drain electrode 150D in plan view and a size equal to the protrusion 160D in XZ plane view.

Note that in a case where the protrusion 160D at an end on the +Y direction side is offset in the −Y direction with respect to an end portion on the +Y direction side of the drain electrode 150D, an end portion in the +Y direction of the area 160DA may be a side surface in the +Y direction (a side surface parallel to the XZ plane) of the protrusion 160D at the end on the +Y direction side. Similarly, in a case where the protrusion 160D at an end on the −Y direction side is offset in the +Y direction with respect to an end portion on the −Y direction side of the drain electrode 150D, an end portion in the −Y direction of the area 160DA may be a side surface in the −Y direction (a side surface parallel to the XZ plane) of the protrusion 160D at the end on the −Y direction side. Here, as an example, description will be given on the assumption that the area 160DA has a size equal to the drain electrode 150D in plan view.

FIG. 1A, which is a cross section taken along line A-A in FIG. 2A, is a cross section including the protrusion 160D, and FIG. 1B, which is a cross section taken along line B-B in FIG. 2A, is a cross section not including the protrusion 160D. Therefore, FIG. 1A illustrates the protrusion 160D and the area 160DA. In FIG. 1A, the area 160DA is slightly enlarged and illustrated outside a contour of the protrusion 160D, but the sizes of the area 160DA and the protrusion 160D in the XZ plane are the same. Furthermore, FIG. 1B also illustrates the area 160DA.

Since such a plurality of protrusions 160D extends to below the upper surface of the electron traveling layer 120, the protrusions 160D are in contact with the 2DEG 120A. Furthermore, the 2DEG 120A also occurs in a portion of the electron traveling layer 120, the portion being included in the area 160DA.

In such a semiconductor device 100, the protrusions 160S and 160D extend in the X direction and are provided parallel to the direction (−X direction) in which the current flows in the electron traveling layer 120, and thus do not divide the current flow in the electron traveling layer 120. Although details of a manufacturing method will be described below, when forming recesses in the electron supply layer 140, the spacer layer 130, and the electron traveling layer 120 in order to form the protrusions 160S and 160D, a portion near the upper surface of the electron traveling layer 120 is not divided in the X direction, and thus there is an advantage that the area where the 2DEG is obtained does not need to be divided in the X direction. Note that the protrusions 160S and 160D extend along the X direction and does not need to extend parallel to the X direction.

Configuration of Passivation Film 170

The passivation film 170 is an insulating film and is a protective film provided on the upper surface of the electron supply layer 140, the upper surface being not covered by the source electrode 150S and the drain electrode 150D. The passivation film 170 can be made of SiN or the like. A film thickness of the passivation film 170 is between 2 nm and 100 nm, and is, for example, 50 nm.

Offset Amounts of Protrusions 160S and 160D

Figure 3A:
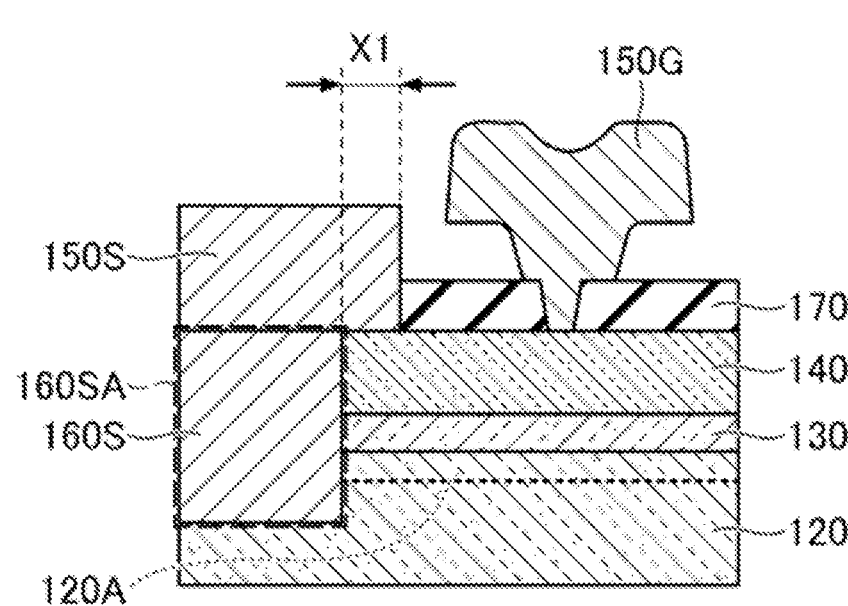
FIG. 3A is a view illustrating an offset amount X1 of an end portion of a protrusion 160S with respect to a source electrode 150S of the semiconductor device 100.
Figure 3A:
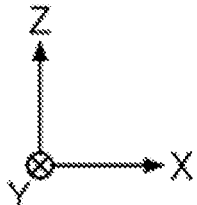
Figure 3B:
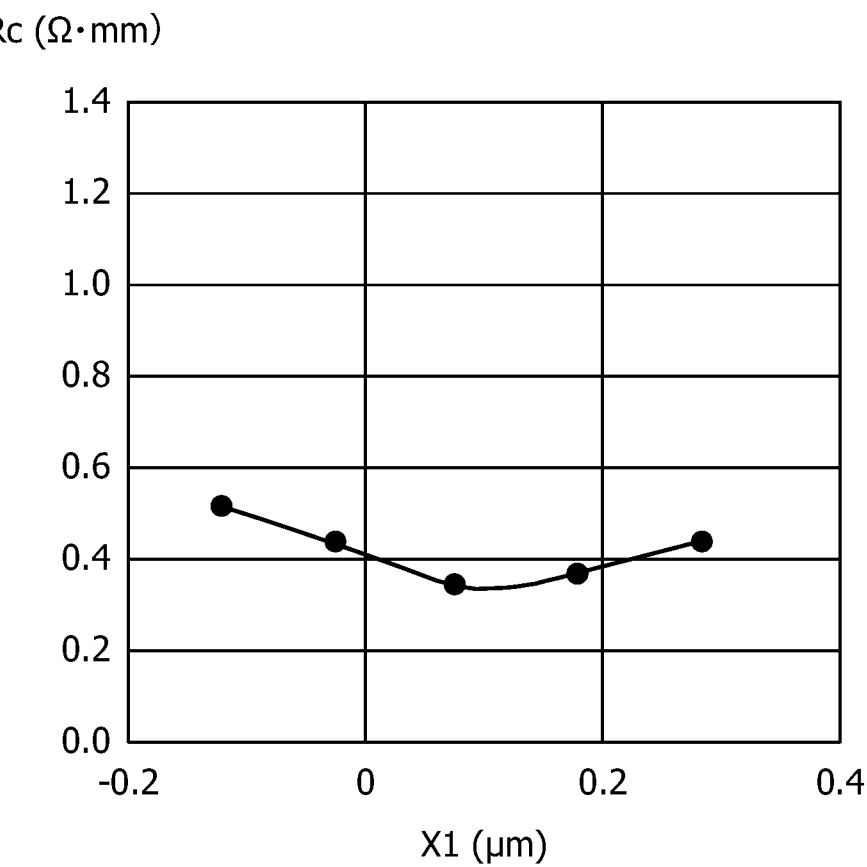
FIG. 3B is a graph illustrating a relationship between the offset amount X1 and a contact resistance Rc.

FIG. 3A is a view illustrating an offset amount $X1$ of an end portion of the protrusion 160S with respect to the source electrode 150S of the semiconductor device 100. FIG. 3B is a graph illustrating a relationship between the offset amount $X1$ and a contact resistance Rc. In FIG. 3B, a horizontal axis represents the offset amount $X1$ ($\mu m$), and a vertical axis represents the contact resistance Rc between the source electrode 150S and the electron traveling layer 120. The contact resistance Rc is represented by resistivity ($\Omega \cdot mm$). Note that FIG. 3B illustrates an experimentally obtained result.

The offset amount $X1$ is the offset amount of the end portion on the +X direction side of the protrusion 160S with respect to the end portion on the +X direction side of the source electrode 150S, as illustrated in FIG. 3A, and exhibits a positive value in a case where the end portion on the +X direction side of the protrusion 160S is located on the −X direction side with respect to the end portion on the +X direction side of the source electrode 150S, as illustrated in FIG. 3A. For example, the offset amount $X1$ exhibits a negative value in a case where the end portion on the +X direction side of the protrusion 160S is offset on the +X direction side with respect to the end portion on the +X direction side of the source electrode 150S.

As illustrated in FIG. 3B, in a case where the offset amount $X1$ becomes a negative value ($X1 < 0$), the protrusion 160S more protrudes in the +X direction and is closer to the gate electrode 150G than the end portion on the +X direction side of the source electrode 150S. In this case, the contact resistance Rc was found to increase (worse). This is because the resistance that increases by a reduced amount of the area of the 2DEG 120A in plan view in the area 160SA including the protrusion 160S is added to the contact resistance Rc due to the extension of the protrusion 160S on the +X direction side.

On the other hand, in a case where the position of the end portion on the +X direction side of the source electrode 150S and the position of the end portion on the +X direction side of the protrusion 160S are equal to each other in the X direction, or the end portion on the +X direction side of the protrusion 160S is more away from the gate electrode 150G than the end portion on the +X direction side of the source electrode 150S (X1≥0), the contact resistance Rc decreased from X1=0 μm to X1=about 0.1 μm, and the contact resistance Rc increased as X1 increased. A value that could be said to be favorable was obtained up to about 0.3 μm of X1. When X1 exceeded 0.3 μm, the contact resistance Rc tended to further increase. This is because a series resistance in the section of 2DEG 120A, which increases by the distance X1 away, is added. The contact resistance Rc being 0.4 Ω·mm or less, which is one index, is from X1=0 μm to 0.25 μm.

From the above, it is favorable that the position of the end portion on the +X direction side of the source electrode 150S and the position of the end portion on the +X direction side of the protrusion 160S are equal to each other in the X direction, or the end portion on the +X direction side of the protrusion 160S is more away from the gate electrode 150G than the end portion on the +X direction side of the source electrode 150S (X1≥0), and moreover, it is favorable that the offset amount X1 is 0 μm to 0.25 μm, both inclusive.

Note that, here, the offset amount X1 of the end portion on the +X direction side of the protrusion 160S with respect to the end portion on the +X direction side of the source electrode 150S has been described, but the same similarly applies to the offset amount of the end portion on the −X direction side of the protrusion 160D with respect to the end portion on the −X direction side of the drain electrode 150D.

Volume Ratio of Protrusions 160S and 160D Inside Areas 160SA and 160DA

Figure 4:
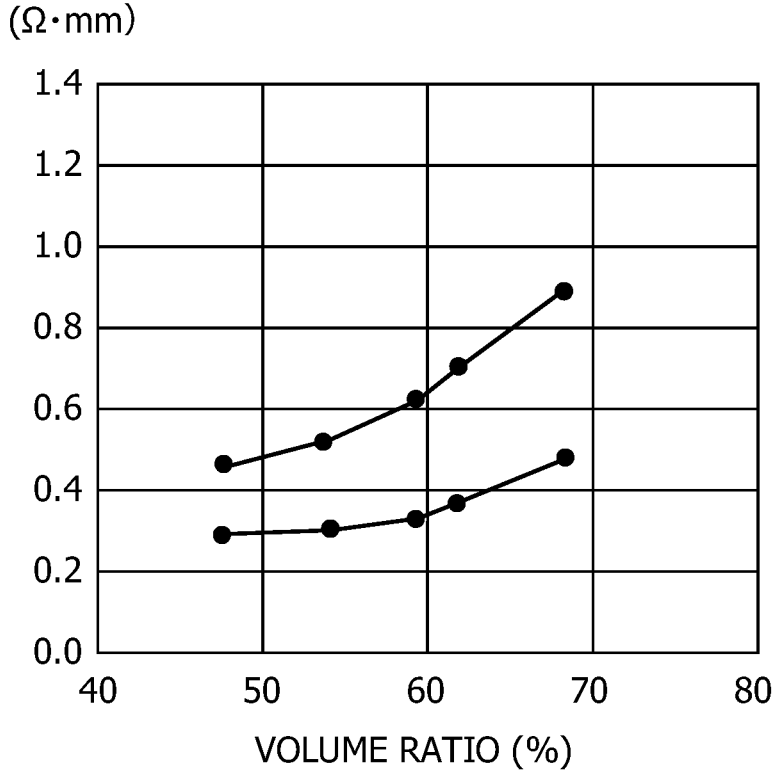
FIG. 4 is a graph illustrating a relationship between a volume ratio of the protrusion 160S in an area 160SA and the contact resistance Rc.

FIG. 4 is a graph illustrating a relationship between a volume ratio of the protrusion 160S in the area 160SA and the contact resistance Rc. This relationship was experimentally obtained. Here, the volume ratio of metal material of the plurality of protrusions 160S in the area 160SA will be described, but the same similarly applies to the volume ratio of metal material of the plurality of protrusions 160D in the area 160DA.

In FIG. 4, characteristics of the contact resistance Rc with respect to the volume ratio in a case where the offset amount X1 is −0.12 μm are illustrated by the solid line, and characteristics of the contact resistance Rc with respect to the volume ratio in a case where the offset amount X1 is 0.08 μm are illustrated by the broken line.

As illustrated in FIG. 4, it was found that the contact resistance Rc increased as the volume ratio increased when the volume ratio was increased from 47.5%. It is considered that this is because when the volume ratio increases, the volume of the protrusion 160S increases and the 2DEG 120A of the electron traveling layer 120 located between the plurality of protrusions 160S decreases.

Since an increase rate of the contact resistance Rc becomes much larger when the volume ratio is increased from 47.5% and exceeds 60% in both the cases where the offset amounts X1 are −0.12 μm and 0.08 μm, it was found that the volume ratio of the plurality of protrusions 160S in the area 160SA was favorably 60% or less.

Figure 5A:
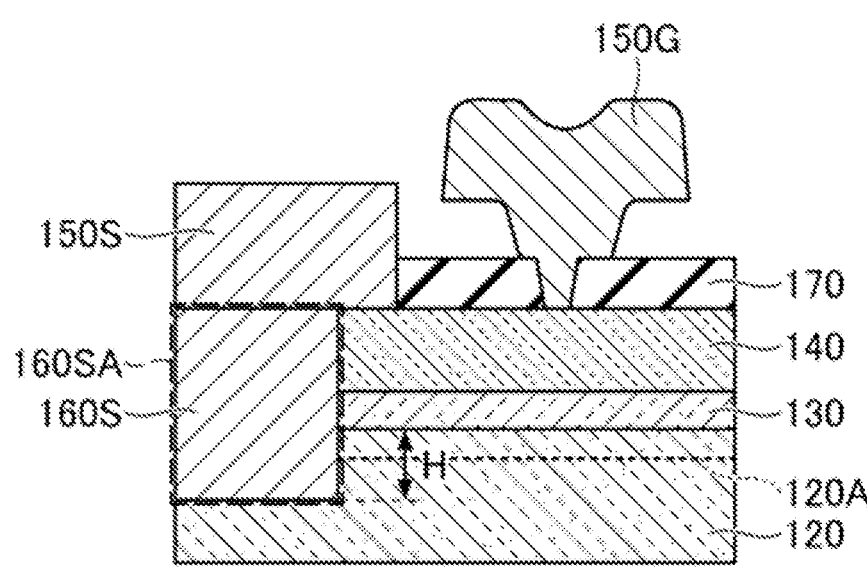
FIG. 5A is a view illustrating a position H in a height direction of a bottom surface of the protrusion 160S.
Figure 5A:
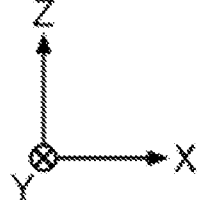
Figure 5B:
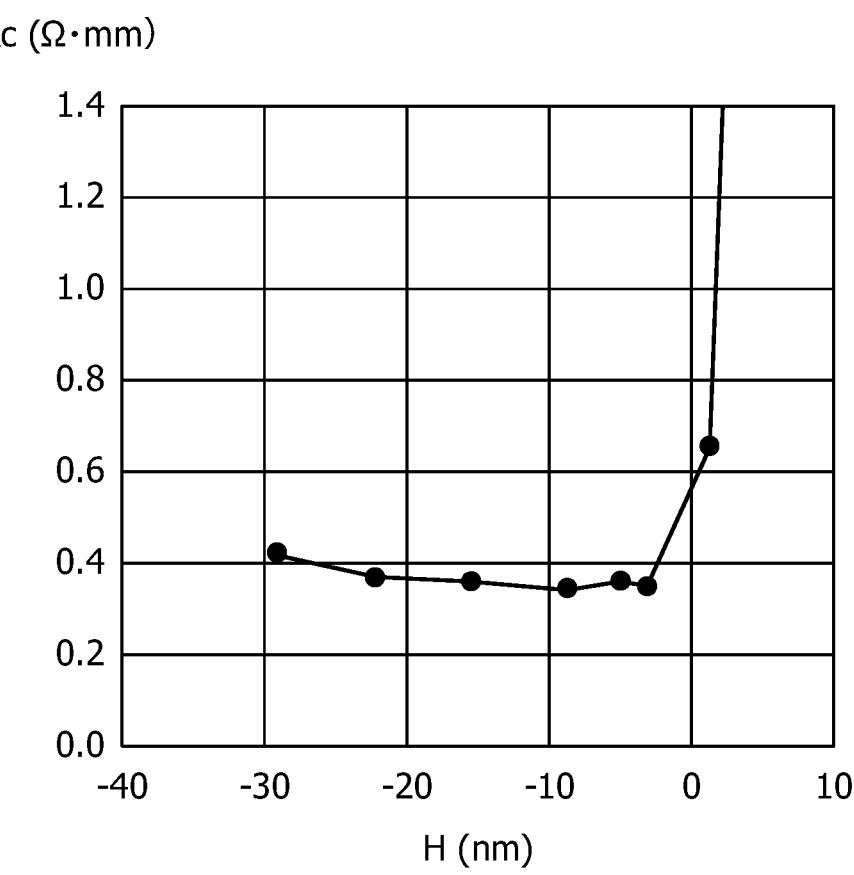
FIG. 5B is a graph illustrating a relationship between the position H and the contact resistance Rc.

Positions of Bottom Surfaces of Protrusions 160S and 160D and Contact Resistance Rc FIG. 5A is a view illustrating a position H in a height direction of a bottom surface of the protrusion 160S. FIG. 5B is a graph illustrating a relationship between the position H and the contact resistance Rc. The relationship illustrated in FIG. 5B was experimentally obtained. Here, the position of the bottom surface of the protrusion 160S will be described, but the same similarly applies to the position of the bottom surface of the protrusion 160D.

Here, the height direction is the Z direction, and the bottom surface of the protrusion 160S is a lower surface of the protrusion 160S. The position H represents the position (nm) in the height direction of the bottom surface of the protrusion 160S from the upper surface of the electron traveling layer 120. Since the upper surface of the electron traveling layer 120 is the interface between the channel and the spacer layer 130, the position H is the position in the height direction of the bottom surface of the protrusion 160S from the interface between the channel and the spacer layer 130. Furthermore, in a case where the position H is 0 nm, the bottom surface of the protrusion 160S is located at the same height as the interface between the channel and the spacer layer 130, and the position H takes a positive value in a case where the bottom surface of the protrusion 160S is higher than the interface between the channel and the spacer layer 130 (located on the +Z direction side). The position H takes a negative value in a case where the bottom surface of the protrusion 160S is lower than the interface between the channel and the spacer layer 130 (located on the −Z direction side).

As illustrated in FIG. 5B, when the value of the position H was increased from −28 nm to 0 nm, the contact resistance Rc gradually decreased as the position H moved from −28 nm to −8 nm, and it was found that a favorable value of the contact resistance Rc was obtained when the contact resistance was −20 nm or higher. Furthermore, it was also found that the position H was substantially constant from −8 nm to −3 nm, and sharply increased when the value was increased above −3 nm. For example, the contact resistance Rc sharply increased when the value of the position H exceeded 0 nm.

Thus, it was found that the contact resistance Rc was low in a case where the bottom surface of the protrusion 160S was located on the lower side of the upper surface of the electron traveling layer 120 (the interface between the channel and the spacer layer 130), but the contact resistance Rc sharply increased when the bottom surface of the protrusion 160S was away above the interface between the channel and the spacer layer 130.

From the above, it was found that the contact resistance Rc exhibited a favorable value in the range where the position H was −20 nm to −3 nm, both inclusive. Here, when the position H of the bottom surface of the protrusion 160S is represented by a position in a depth direction where depth from the upper surface of the electron traveling layer 120 is positive, the position H being −20 nm to −3 nm, both inclusive means that the bottom surface of the protrusion 160S is located at a position of 3 nm to 20 nm, both inclusive, in the depth direction from the upper surface of the electron traveling layer 120.

Density of Protrusions 160S and 160D

Figure 6A:
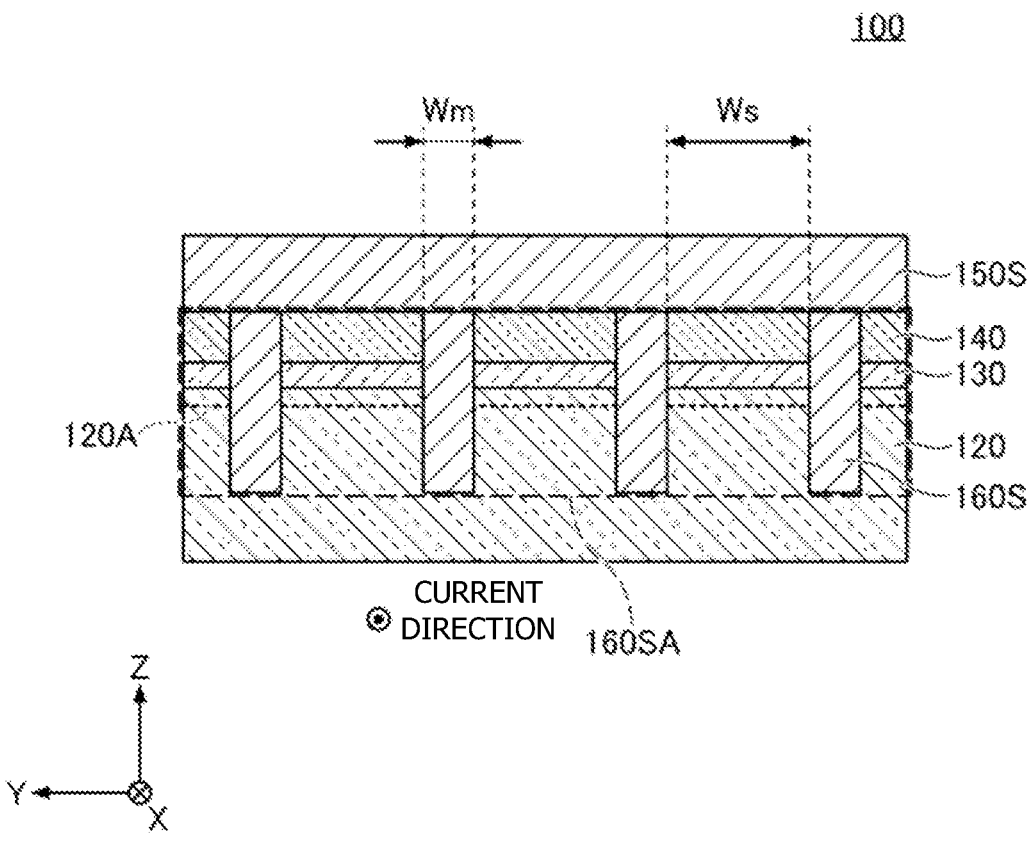
FIG. 6A is a view illustrating a width Wm and an interval Ws of the protrusion 160S.
Figure 6B:
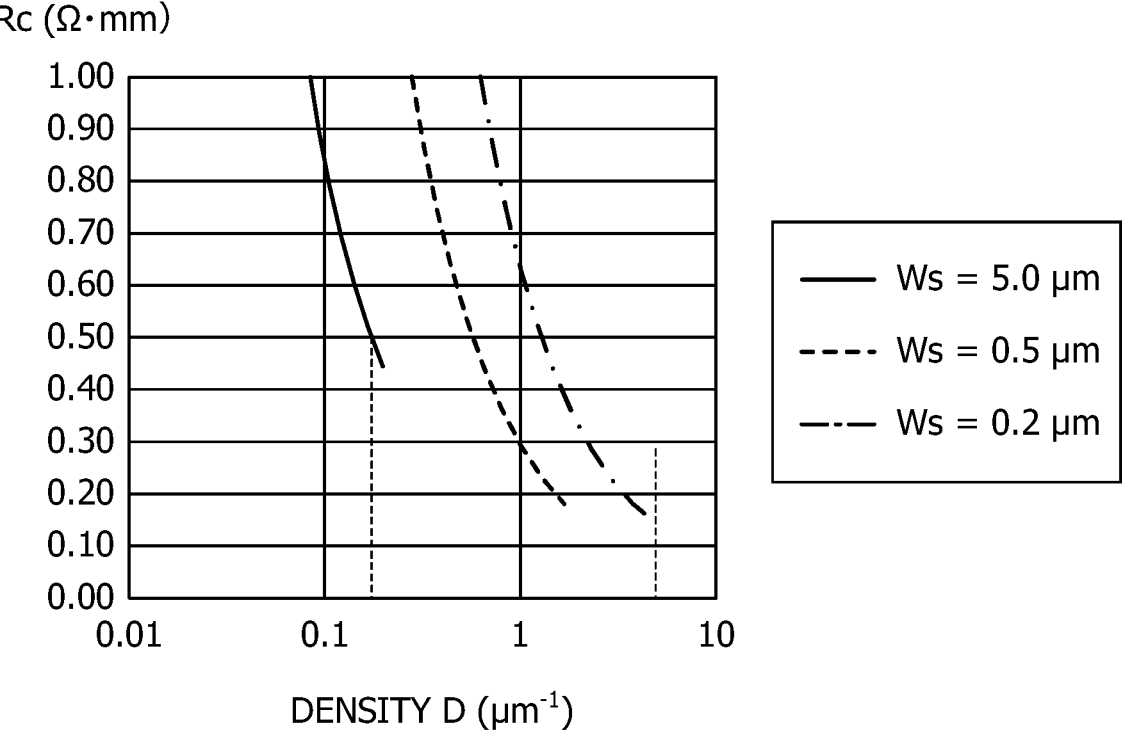
FIG. 6B is a graph illustrating a relationship between density of the protrusion 160S and the contact resistance Rc.

FIG. 6A is a view illustrating a width Wm and an interval Ws of the protrusion 160S. FIG. 6B is a graph illustrating a relationship between density of the protrusion 160S and the contact resistance Rc. The relationship illustrated in FIG. 6B was obtained by simulation. Here, the relationship between the density of the protrusion 160S and the contact resistance Rc will be described, but the same similarly applies to the relationship between the density of the protrusion 160D and the contact resistance Rc.

The width Wm is a width in the Y direction of the protrusion 160S. The interval Ws is an interval between adjacent protrusions 160S, and corresponds to a width in the Y direction of the nitride semiconductor layers (the electron traveling layer 120, the spacer layer 130, and the electron supply layer 140) between the adjacent protrusions 160S.

Density D of the protrusion 160S is density indicating how many protrusions 160S are arranged in 1 μm in the Y direction in the area 160SA. The density D (μm$^{-1}$) of the protrusion 160S can be expressed by the following equation (1). The unit of the density D is synonymous with pieces/μm.

$$D=(Wm+Ws)^{-1} \tag{1}$$

When the interval Ws was set to 5.0 μm, 0.5 μm, and 0.2 μm to change the density D, and the contact resistance Rc was calculated, the results illustrated in FIG. 6B were obtained. When the interval Ws is fixed and the density D is changed, the width Wm is changed. At any interval Ws, the contact resistance Rc tends to increase as the density D decreases. This is because metal portion of the protrusion 160S decreases.

Here, a lower limit of the density D was set to 0.2 μm$^{-1}$ from the viewpoint of obtaining a favorable contact resistance Rc. Furthermore, an upper limit of the density D was set to 5.0 μm$^{-1}$ when fabricating the plurality of protrusions 160S arrayed in the Y direction in the area 160SA. This is because it is difficult to fabricate the plurality of protrusions 160S when the density D exceeds 5.0 μm$^{-1}$.

Furthermore, it is found that the density D at which contact resistance Rc becomes equal to or less than a predetermined value (for example, 0.5 Ω·mm) is obtained by setting the interval Ws to various values such as 5.0 μm, 0.5 μm, and 0.2 μm from FIG. 6B. Therefore, the contact resistance Rc may be reduced by selecting the interval Ws according to the density D.

From the above, it was found that the density D was favorable in the range of 0.2 μm$^{-1}$ to 5.0 μm$^{-1}$, both inclusive.

Method for Manufacturing Semiconductor Device 100

Figure 7A:
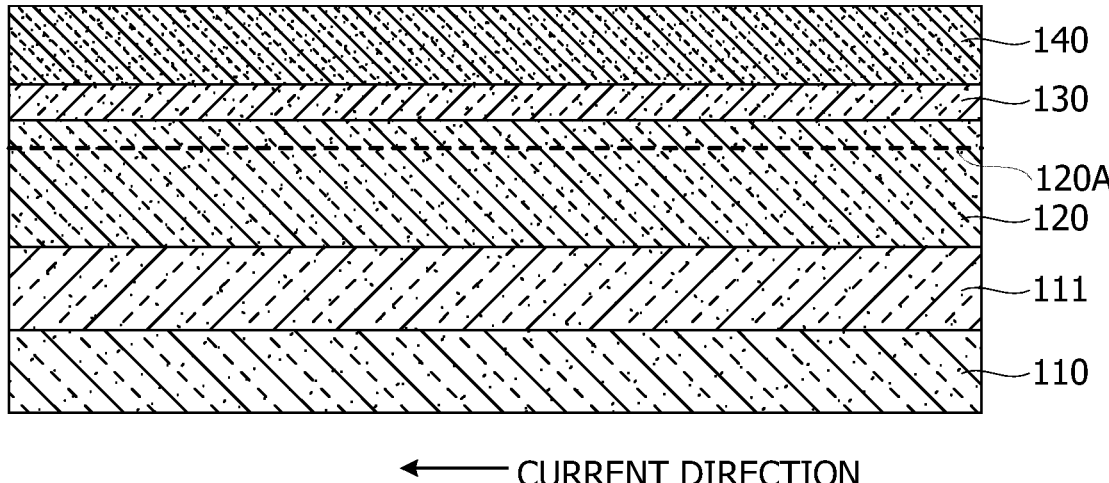
FIG. 7A is a view for describing a method for manufacturing the semiconductor device 100.
Figure 7B:
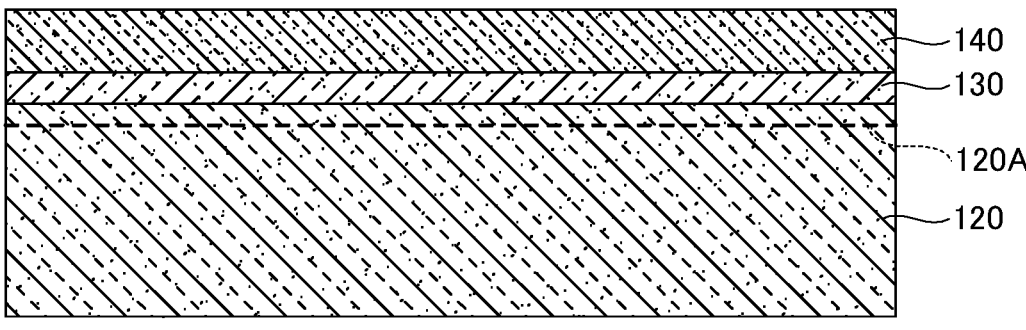
FIG. 7B is a view for describing the method for manufacturing the semiconductor device 100.
Figure 7B:
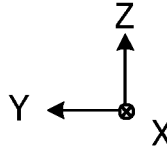
Figure 7C:
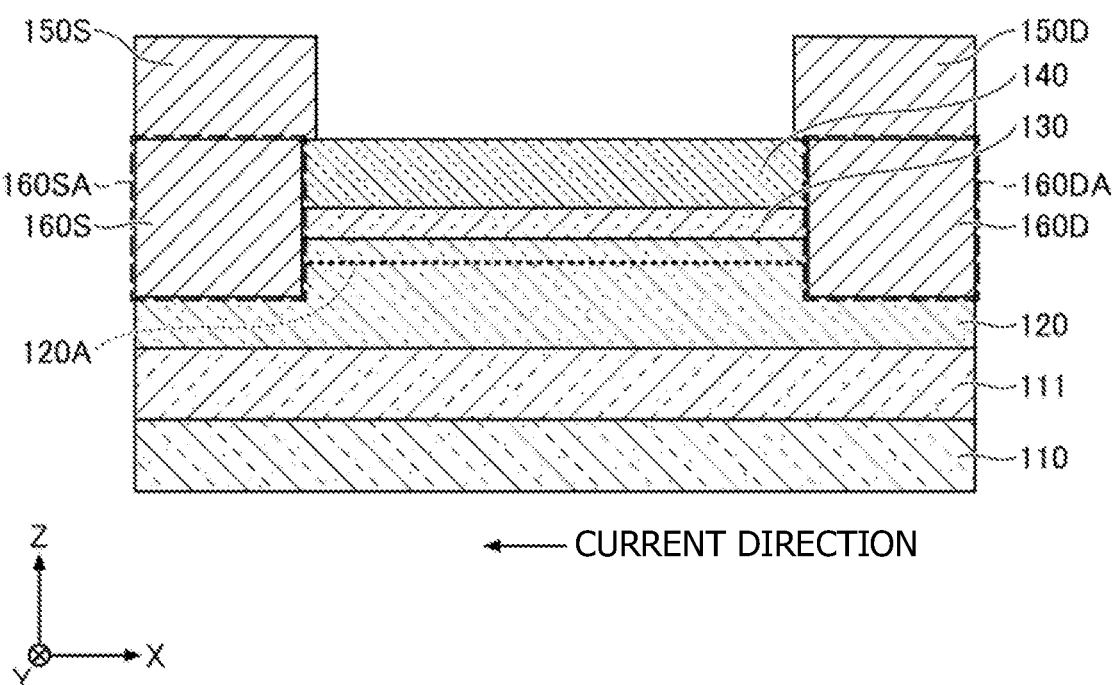
FIG. 7C is a view for describing the method for manufacturing the semiconductor device 100.
Figure 7D:
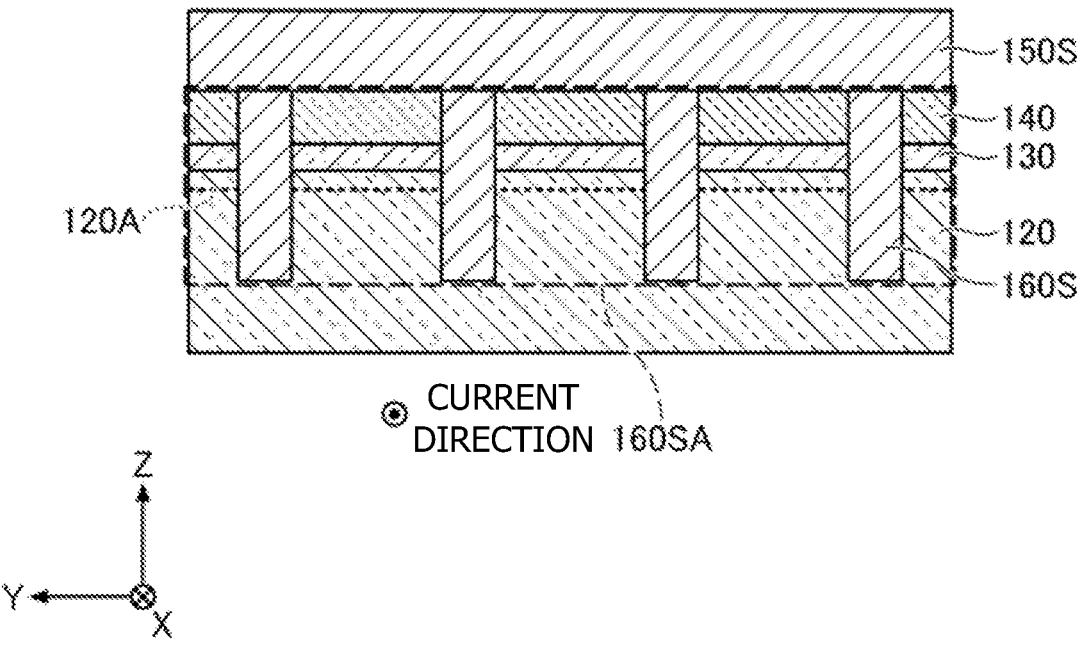
FIG. 7D is a view for describing the method for manufacturing the semiconductor device 100.
Figure 7E:
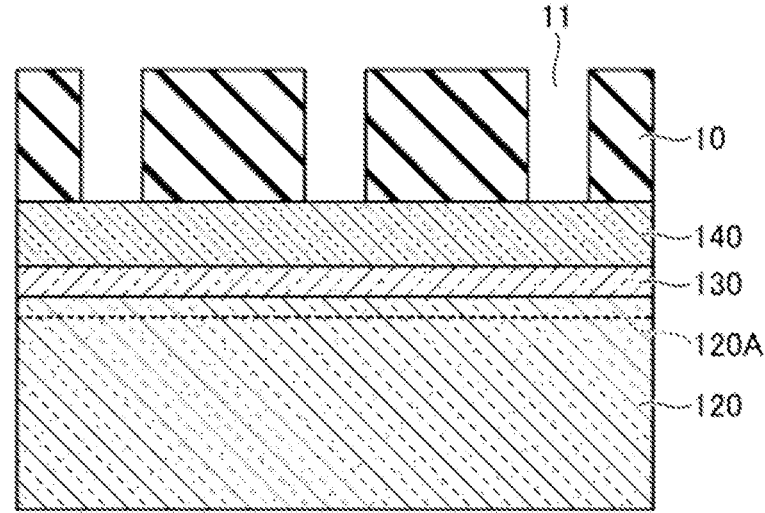
FIG. 7E is a view for describing the method for manufacturing the semiconductor device 100.
Figure 7E:
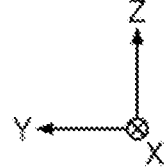
Figure 7F:
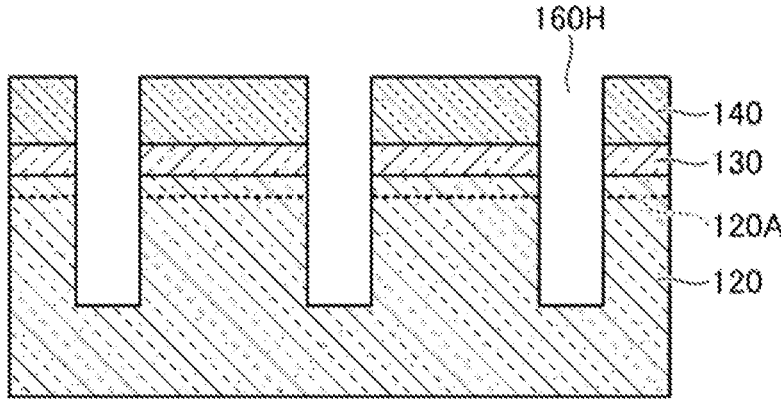
FIG. 7F is a view for describing the method for manufacturing the semiconductor device 100.
Figure 7F:
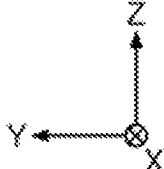
Figure 7G:
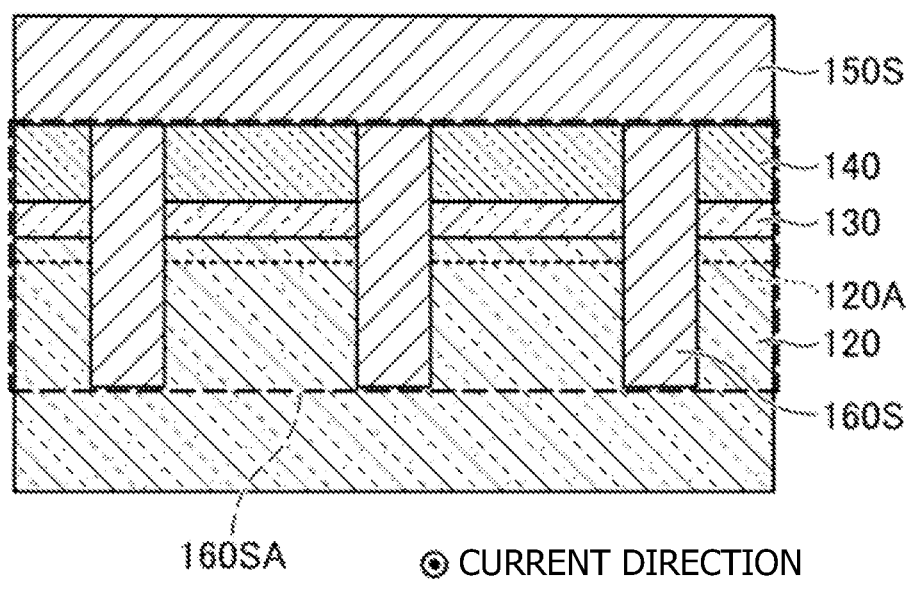
FIG. 7G is a view for describing the method for manufacturing the semiconductor device 100.
Figure 7G:
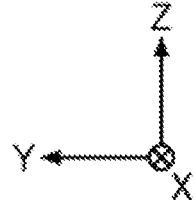
Figure 7H:
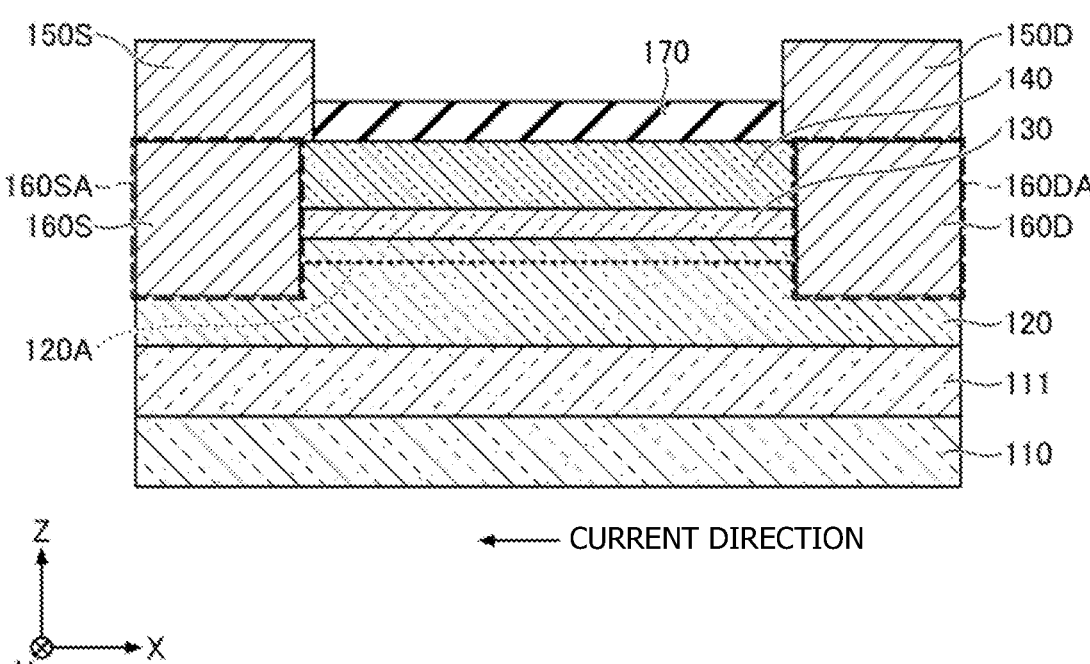
FIG. 7H is a view for describing the method for manufacturing the semiconductor device 100.
Figure 7I:
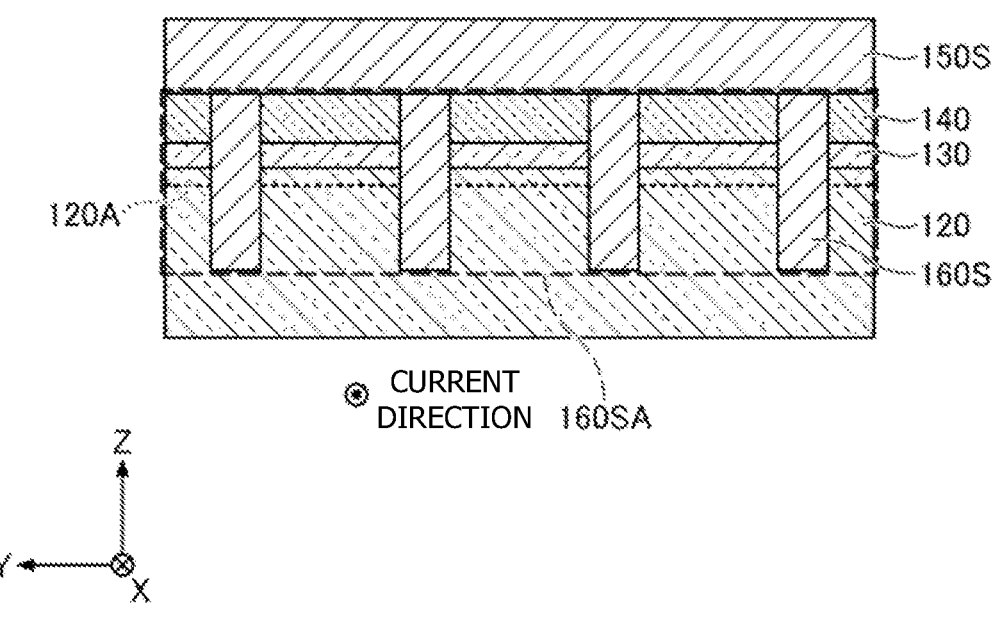
FIG. 7I is a view for describing the method for manufacturing the semiconductor device 100.

FIGS. 7A to 7I are views for describing a method for manufacturing the semiconductor device 100. FIGS. 7A, 7C, and 7H illustrate cross sections parallel to the XZ plane during a manufacturing process of the semiconductor device 100. FIGS. 7B, 7D, 7E, 7F, 7G, and 7I are views illustrating cross-sectional structures of a part of the semiconductor device 100 during the manufacturing process thereof, and are views illustrating cross sections parallel to the YZ plane corresponding to a part of the semiconductor device 100 illustrated in FIG. 2B. FIGS. 7A and 7B illustrate cross sections in the same manufacturing process, FIGS. 7C and 7D illustrate cross sections in the same manufacturing process, and FIGS. 7H and 7I illustrate cross sections in the same manufacturing process.

First, as illustrated in FIGS. 7A and 7B, the initial layer 111, the electron traveling layer 120, the spacer layer 130, and the electron supply layer 140 are epitaxially grown on the substrate 110 by metal organic chemical vapor deposition (MOCVD) in this order. By forming the electron supply layer 140 above the electron traveling layer 120, the 2DEG 120A is generated directly below the interface of the electron traveling layer 120 with the spacer layer 130.

Next, an inactive area is formed by an element separation process (not illustrated), and an active area is defined. For example, a resist pattern having an opening is formed in an area where an element separation area is formed by photolithography. Next, an inactive area is formed by injecting argon (Ar) ions into the nitride semiconductor layers (the electron traveling layer 120, the spacer layer 130, and the electron supply layer 140) in an area where no resist pattern is formed. The inactive area may be formed by removing a part of the nitride semiconductor layers in the area where no resist pattern is formed by dry etching with reactive ion etching (RIE) or the like using a chlorine-based gas. After forming the element separation area, the resist pattern is removed with an organic solvent or the like.

Next, as illustrated in FIGS. 7C and 7D, the source electrode 150S, the drain electrode 150D, the protrusion 160S, and the protrusion 160D are formed. For example, it is as illustrated in FIGS. 7E to 7G. FIGS. 7E to 7G illustrate the cross-sectional structures of the portion including the three protrusions 160S, of the cross section including the four protrusions 160S illustrated in FIG. 7I.

As illustrated in FIG. 7E, a pattern of a resist 10 having an opening portion 11 is formed in a portion where the protrusions 160S and 160D are to be formed by photolithography or electron beam (EB) lithography.

Next, as illustrated in FIG. 7F, a portion of the electron supply layer 140, the spacer layer 130, and the electron traveling layer 120 is removed to form a recess 160H, the portion being located directly below the opening portion 11 in which the resist 10 does not exist. For the removal, dry etching such as RIE using a chlorine-based gas is used. Etching depth when forming the recess 160H is deeper than the interface between the channel and the spacer layer 130 (the upper surface of the electron traveling layer 120), and further, the depth of the recess 160H from the interface between the channel and the spacer layer 130 is favorably 3 nm to 20 nm, both inclusive. Thereafter, the resist 10 is removed.

Here, the recess 160H has a longitudinal direction parallel to the X direction by extending in the X direction, similar to the protrusions 160S and 160D to be formed later. Therefore, since the portion near the upper surface of the electron traveling layer 120 is not divided in the X direction, the area where the 2DEG 120A can be obtained does not need to be divided in the X direction. For example, in a case where the recess 160H has a longitudinal direction in the Y direction, the area where the 2DEG 120A can be obtained is divided in the X direction. Since the recess 160H has the longitudinal direction parallel to the X direction, the portion near the upper surface of the electron traveling layer 120 is not divided in the X direction. Therefore, it is possible to suppress an increase in a sheet resistance Rsh in the electron traveling layer 120 and increase the current.

Next, a resist pattern having an opening portion is formed on an area where the source electrode 150S and the drain electrode 150D are to be formed of the upper surface of the electron supply layer 140 by photolithography. Thereafter, metal is vapor-deposited by a vacuum vapor deposition method. As the metal, for example, a laminated film having Ti of 2 nm to 50 nm in the first layer and Al of 100 nm to 300 nm in the second layer is conceivable. At this time, the protrusions 160S and 160D are formed inside the recesses 160H for the protrusions 160S and 160D. Thereafter, by removing the metal other than the source electrode 150S and the drain electrode 150D by a lift-off technique, the structure illustrated in FIG. 7G is obtained. The source electrode 150S and drain electrode 150D and the protrusions 160S and 160D are made of the same electrode material.

Next, by performing heat treatment (alloying treatment) at 500° C. to 650° C. in a nitrogen atmosphere, ohmic contact is established between the source electrode 150S and the protrusion 160S, and the drain electrode 150D and the protrusion 160D. As a result, the source electrode 150S, the drain electrode 150D, the protrusion 160S, and the protrusion 160D are formed. Furthermore, surface damage of the nitride semiconductor layer can be minimized.

The protrusions 160S and 160D have the structure in which thin metal wall portions used for the source electrode 150S and the drain electrode 150D and the nitride semiconductor layer are alternately arrayed in the Y direction, and the longitudinal direction (X direction) in plan view of the nitride semiconductor layer and the thin metal wall portions to be arrayed is the same as the current flow direction (−X direction). Furthermore, as described with reference to FIG. 4, the volume ratio of the metal of the protrusions 160S and 160D in the areas 160SA and 160SD is favorably 60% or less from the viewpoint of reducing the contact resistance Rc. Furthermore, the areas 160SA and 160DA in which the protrusions 160S and 160D are respectively arranged are favorably more separated than the source electrode 150S and the drain electrode 150D from the viewpoint of reducing the contact resistance Rc, as viewed from the gate electrode 150G, and the offset amount X1 is favorably 0 μm to 0.25 μm, both inclusive, as described with reference to FIGS. 3A and 3B.

Next, as illustrated in FIG. 7H, an insulating film that becomes the passivation film 170 is formed on the electron supply layer 140 by plasma chemical vapor deposition (CVD). The cross section parallel to the YZ plane including the source electrode 150S at this time is illustrated in FIG. 7I. The insulating film can be formed of SiN or the like, and the film thickness is between 2 nm and 100 nm, for example, 50 nm. Note that the insulating film may be formed by atomic layer deposition (ALD) or sputtering. Furthermore, the insulating film may be formed of an oxide of Si, Al, hafnium (Hf), zirconium (Zr), tantalum (Ta), or the like other than SiN, a nitride, an oxynitride, or a laminated film thereof.

Next, when the gate electrode 150G is formed, the cross-sectional structure illustrated in FIGS. 1A and 1B is obtained. For example, a resist pattern having an opening portion is formed in an area where the gate electrode 150G is to be formed, and metal is vapor-deposited by a vacuum vapor deposition method. As the metal, for example, a laminated film having Ni of 5 nm to 30 nm in the first layer and Au of 100 nm to 300 nm in the second layer can be formed. Then, the metals other than the gate electrode 150G are removed together with the resist by lift-off. Through the above processes, the semiconductor device 100 having the structures illustrated in FIGS. 1A, 1B, 2A, and 2B can be fabricated.

Effects

As described above, in the semiconductor device 100, the protrusions 160S and 160D extend from the lower surfaces (lower ends) of the source electrode 150S and the drain electrode 150D through the inside of the electron supply layer 140 and the spacer layer 130, respectively, to below the upper surface of the electron traveling layer 120, and are formed of the electrode material of the source electrode 150S and the drain electrode 150D. Therefore, the protrusions 160S and 160D are in contact with the 2DEG 120A generated inside the electron traveling layer 120. Furthermore, the volume ratios of the plurality of protrusions 160S and the plurality of protrusions 160D in the areas both 160SA and 160DA are 60% or less. Therefore, the contact resistance Rc can be suppressed low.

Therefore, the semiconductor device 100 capable of reducing the contact resistance Rc and the method for manufacturing the semiconductor device 100 can be provided. Furthermore, the source electrode 150S and the drain electrode 150D, which have the low contact resistance Rc at a relatively low temperature (<650° C.), can be formed even in the structure in which an Al composition ratio in the electron supply layer 140 is set to 45% or more, and the spacer layer 130 is included.

Furthermore, in next-generation communication beyond fifth generation (5G)/sixth generation (6G) (B5G), use of ultra-high frequency radio waves such as 100 GHz band or 300 GHz band is being examined to implement 100 Gbps-class communication speed. These bands are frequency bands so-called millimeter wave bands. A problem when using radio waves of the ultra-high frequency bands is that the communication distance is short, and for example, this problem is caused by a larger amount of attenuation in the atmosphere than that of the radio waves used in the communication generation of 5G or earlier. However, there is still a problem of absence of an amplifier with sufficient output. Therefore, there is an urgent need to implement a high-output amplifier that operates in the ultra-high frequency band, and the semiconductor device 100 can increase the current in the electron traveling layer 120 by reducing the contact resistance and thus can be used as an amplifier such as a power amplifier that amplifies a signal in the ultra-high frequency band.

Furthermore, examples of the existing technique for obtaining the ohmic contact include a recess ohmic technique, selective regrowth, and ion implantation. The recess ohmic technique is a technique for thinning (recessing) an electron supply layer that becomes a barrier between metal and a channel, and has an advantage that the heat treatment is conducted at a relatively low temperature of about 600° C., but there is a problem of a difficulty in reducing the contact resistance Rc between the metal and the nitride semiconductor layer. Furthermore, the selective regrowth is a growing method for forming n-GaN by a crystal growth technique, but the method requires a high-temperature process of about 800° C. during crystal growth, and there is a problem that an increase in the sheet resistance Rsh due to surface damage is not avoided. Furthermore, the ion implantation is a method for forming n-GaN by an ion implantation technique, but the method requires a high-temperature process of about 1000° C. or higher to activate impurities, and there is a problem that an increase in the sheet resistance Rsh due to surface damage is not avoided. From this kind of circumstance, there are two requirements for the technique for obtaining the ohmic contact: low resistance between the metal and the nitride semiconductor layer, and the heat treatment temperature of 650° C. or less. The semiconductor device 100 is very promising in meeting these two requirements.

Furthermore, the plurality of protrusions 160S is a plurality of thin plate-shaped protrusions extending along the X direction connecting the source electrode 150S and the drain electrode 150D in plan view, and arrayed in the Y direction intersecting the X direction in plan view, and the plurality of protrusions 160D is a plurality of thin-shaped protrusions extending in the X direction and arrayed in the Y direction. Therefore, the plurality of protrusions 160S and 160D extends in the electron traveling layer 120 along the direction in which the current flows (–X direction), and do not divide the current flow in the electron traveling layer 120. In the manufacturing process, when forming the recess 160H (see FIG. 7F) in the electron supply layer 140, the spacer layer 130, and the electron traveling layer 120 in order to form the protrusions 160S and 160D, the portion near the upper surface of the electron traveling layer 120 is not divided in the X direction, and thus the area where the 2DEG 120A is obtained does not need to be divided in the X direction. Furthermore, even if the protrusion 160S is provided, an increase in the sheet resistance Rsh of the electron traveling layer 120 can be suppressed. Therefore, the semiconductor device 100 capable of increasing the current in the electron traveling layer 120 can be provided.

Furthermore, the end portions of the plurality of protrusions 160S on the drain electrode 150D side in the X direction are offset in the direction away from the drain electrode 150D with respect to the end portion of the source electrode 150S on the drain electrode 150D side in the X direction. Similarly, the end portions of the plurality of protrusions 160D on the source electrode 150S side in the X direction are offset in the direction away from the source electrode 150S with respect to the end portion of the drain electrode 150D on the source electrode 150S side in the X direction. Therefore, the contact resistance Rc between the source electrode 150S and the drain electrode 150D, and the electron traveling layer 120 can be reduced.

Furthermore, the offset amount X1 in the X direction of the plurality of protrusions 160S and 160D is 0 μm to 0.25 μm, both inclusive. Therefore, the contact resistance Rc between the source electrode 150S and the drain electrode 150D, and the electron traveling layer 120 can be more effectively reduced, and the semiconductor device 100 capable of more effectively reducing the contact resistance Rc and the method for manufacturing the semiconductor device can be provided.

Furthermore, the bottom surfaces of the plurality of protrusions 160S and 160D are located at the positions of 3 nm to 20 nm, both inclusive, in the depth direction from the upper surface of the electron traveling layer 120. Even with the configuration, the contact resistance Rc between the source electrode 150S and the drain electrode 150D, and the electron traveling layer 120 can be more effectively reduced, and the semiconductor device 100 capable of more effectively reducing the contact resistance Rc and the method for manufacturing the semiconductor device can be provided.

Furthermore, since the electron traveling layer 120 has the 2DEG 120A inside the area 160SA and the area 160SA, even if the protrusions 160S and 160D are formed at positions in the depth direction reaching the inside of the electron traveling layer 120, the channel by the 2DEG 120A inside the areas 160SA and 160DA can be generated, and the semiconductor device 100 having favorable operation characteristics and the method for manufacturing the semiconductor device can be provided.

Furthermore, since the density D of the protrusion 160S in the Y direction in the area 160SA and the density D of the protrusion 160D in the Y direction in the area 160DA are 0.2 μm⁻¹ to 5.0 μm⁻¹, both inclusive, it is possible to achieve reduction in the contact resistance Rc by selecting the interval Ws according to the density D.

Second Embodiment

Figure 8A:
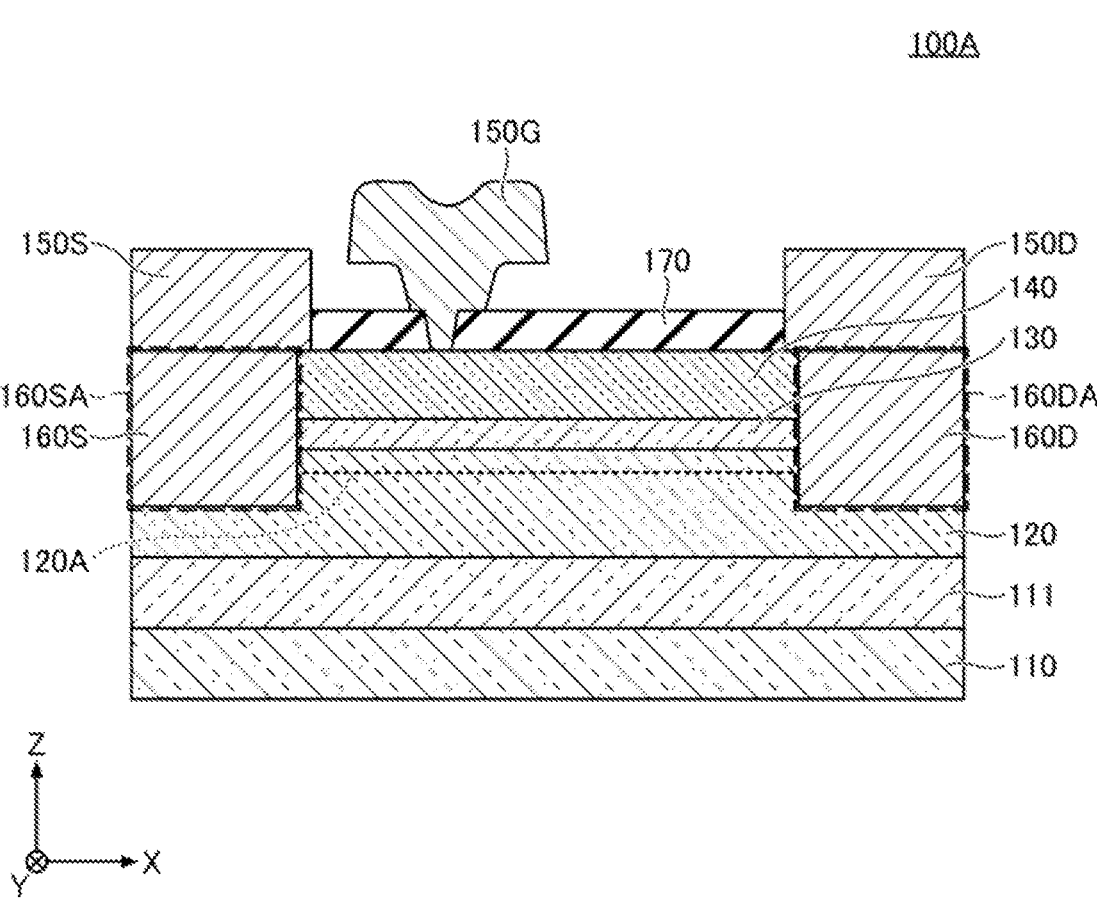
FIG. 8A is a view illustrating a cross-sectional structure of a semiconductor device 100A of a second embodiment.
Figure 8B:
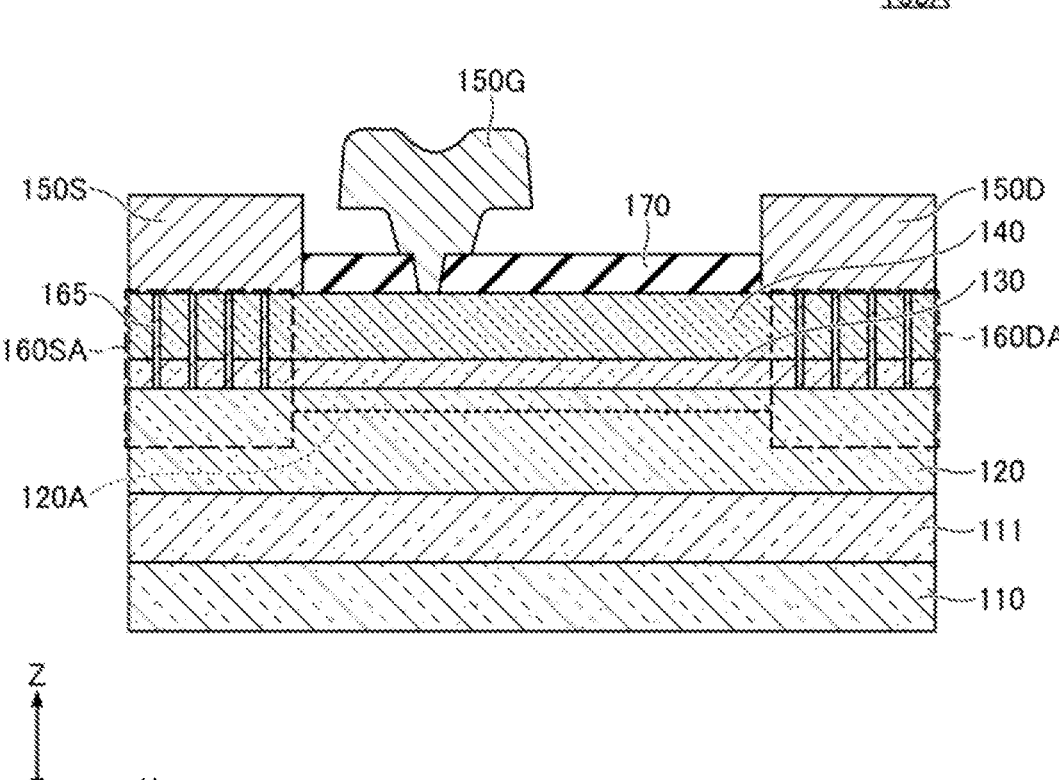
FIG. 8B is a view illustrating a cross-sectional structure of the semiconductor device 100A of the second embodiment.
Figure 8C:
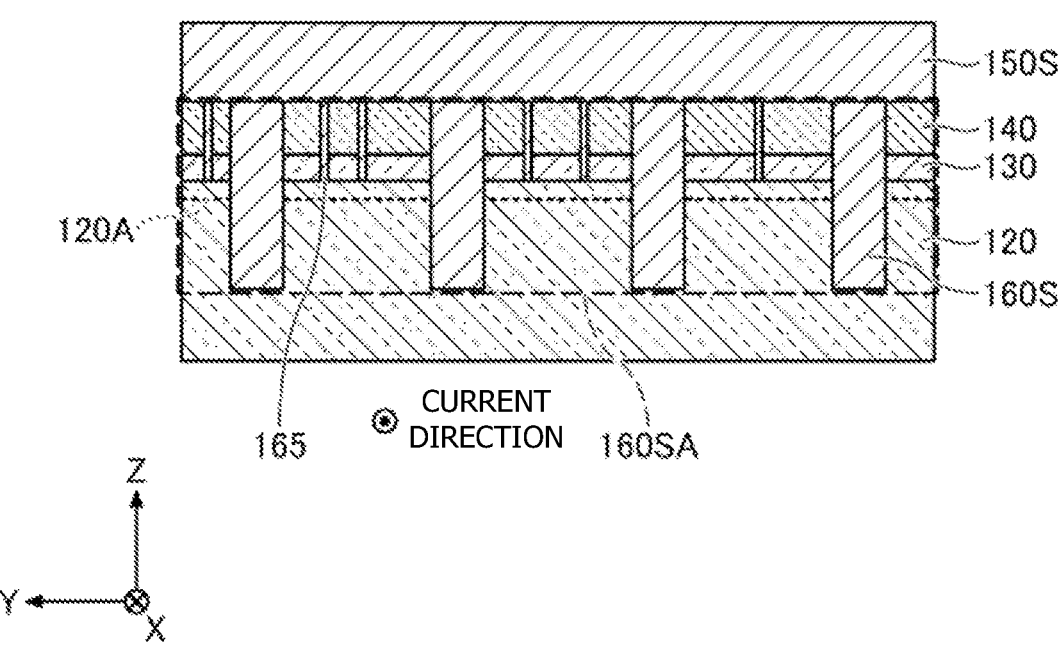
FIG. 8C is a view illustrating a cross-sectional structure of a part of the semiconductor device 100A.

FIGS. 8A and 8B are views illustrating a cross-sectional structure of a semiconductor device 100A of a second embodiment. FIG. 8C is a view illustrating a cross-sectional structure of a part of the semiconductor device 100A. The cross sections illustrated in FIGS. 8A and 8B respectively correspond to the cross sections illustrated in FIGS. 1A and 1B of the first embodiment, and the cross section illustrated in FIG. 8C corresponds to the cross section illustrated in FIG. 2B.

Configuration of Semiconductor Device 100A

The semiconductor device 100A has a configuration in which a metal portion 165 is added to an inside of a spacer layer 130 and an electron supply layer 140 among nitride semiconductor layers inside areas 160SA and 160DA with respect to the semiconductor device 100 of the first embodiment. Hereinafter, differences from the semiconductor device 100 of the first embodiment will be mainly described.

The metal portion 165 is a substantially columnar metal portion extending from an upper surface of the electron supply layer 140 to the inside of the spacer layer 130. Such a metal portion 165 is formed by forming a pit (hole) penetrating the nitride semiconductor layers from the upper surface of the electron supply layer 140 to the inside of the spacer layer 130 inside the areas 160SA and 160DA, and embedding an inside of the pit with metal material of a source electrode 150S and a drain electrode 150D by vapor deposition or the like. Note that FIGS. 8B and 8C illustrate a state in which the metal portion 165 extends to a lower surface of the spacer layer 130. However, when the pit is formed by wet etching, an etching solution may be selected such that the etching is automatically stopped inside the spacer layer 130. Thereby, a lower end of the pit is located between an upper surface and the lower surface of the spacer layer 130 (inside the spacer layer 130), and a lower end of the metal portion 165 is also located inside the spacer layer 130.

Since the metal portion 165 is provided inside the electron supply layer 140 and the spacer layer 130 in the areas 160SA and 160DA, the metal portion does not exist in the cross section illustrated in FIG. 8A and exists in the cross section illustrated in FIG. 8B not including the protrusions 160S and 160D. The cross-sectional structure in an XZ plane is illustrated in FIG. 8C.

In the nitride semiconductor layers provided with the metal portion 165 inside the areas 160SA and 160DA, a ratio of the metal portion 165 is adjusted such that elements constituting the nitride semiconductor layers occupy 80% or more in volume ratio. For example, in the nitride semiconductor layers provided with the metal portion 165 inside the areas 160SA and 160DA, the ratio of the metal portion 165 is adjusted such that the metal constituting the metal portion 165 becomes lower than 20% in volume ratio.

The metal portion 165 is provided to reduce a contact resistance Rc, but if the ratio of the metal portion 165 is too large, the resistance of the metal portion 165 is added to the contact resistance Rc. The figure of 80% is a value obtained by experiment and simulation.

Method for Manufacturing Semiconductor Device 100A

Since a method for manufacturing the semiconductor device 100A is the same as the method for manufacturing the semiconductor device 100 of the first embodiment up to the processes described with reference to FIGS. 7A and 7B in the first embodiment, processes after the processes illustrated in FIGS. 7A and 7B will be described with reference to FIGS. 8D to 8G. FIGS. 8D to 8G are views for describing the method for manufacturing the semiconductor device 100A of the second embodiment.

It is assumed that an initial layer 111, an electron traveling layer 120, the spacer layer 130, and the electron supply layer 140 are formed on a substrate 110 (see FIGS. 7A and 7B), and an element separation process has been completed.

Figure 8D:
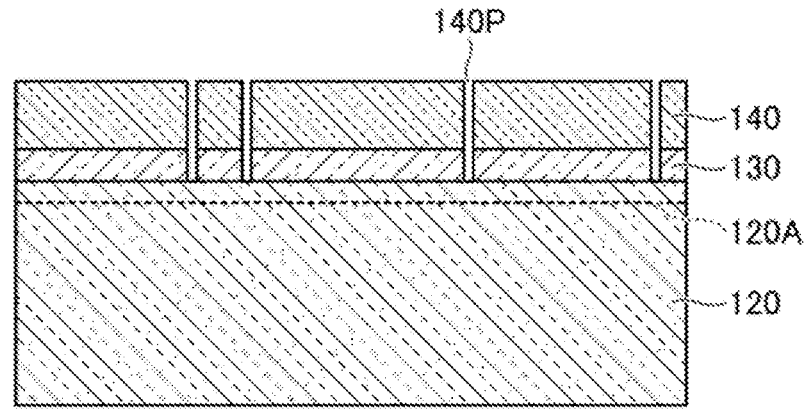
FIG. 8D is a view for describing a method for manufacturing the semiconductor device 100A of the second embodiment.
Figure 8D:
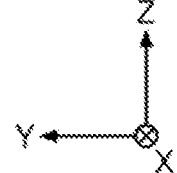

Next, as illustrated in FIG. 8D, a pit 140P is formed. In the nitride semiconductor layers provided with the metal portion 165 inside the areas 160SA and 160DA, the number and size of the pits 140P in which the metal portion 165 is to be formed later may be adjusted so that the elements constituting the nitride semiconductor layers occupy 80% or more in volume ratio.

A protective film (for example, SiN) having an opening portion is formed in an area for forming the pit 140P in an area for forming the areas 160SA and 160DA, and the pit 140P is formed by wet etching. As a chemical solution, for example, tetra methylammonium hydroxide (TMAH), potassium hydroxide, sodium hydroxide, sulfuric acid, hydrogen peroxide solution, or a mixed solution thereof may be used. Solution temperature and stirring speed may be changed in order to increase etching power. For example, by heating and immersing TMAH of about 25 wt % at about 80° C., etching proceeds starting from crystal defects or the like, and the pit 140P having a diameter of several nm to several tens of nm is formed. Furthermore, it is also possible to automatically stop the etching in a depth direction in the spacer layer 130. Thereafter, the protective film is removed. Thereby, in the area for forming the areas 160SA and 160DA, the pit 140P reaching the spacer layer 130 from the upper surface of the electron supply layer 140 can be formed.

Figure 8E:
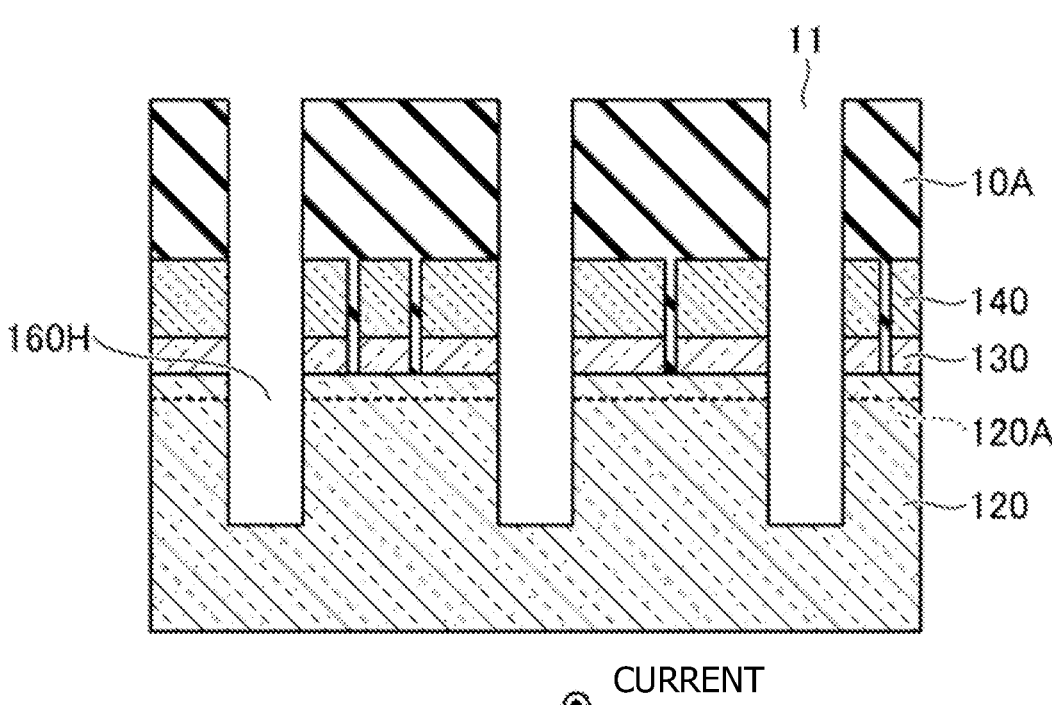
FIG. 8E is a view for describing the method for manufacturing the semiconductor device 100A of the second embodiment.
Figure 8E:
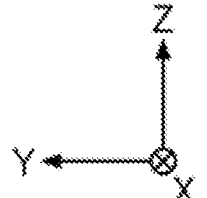
Figure 8F:
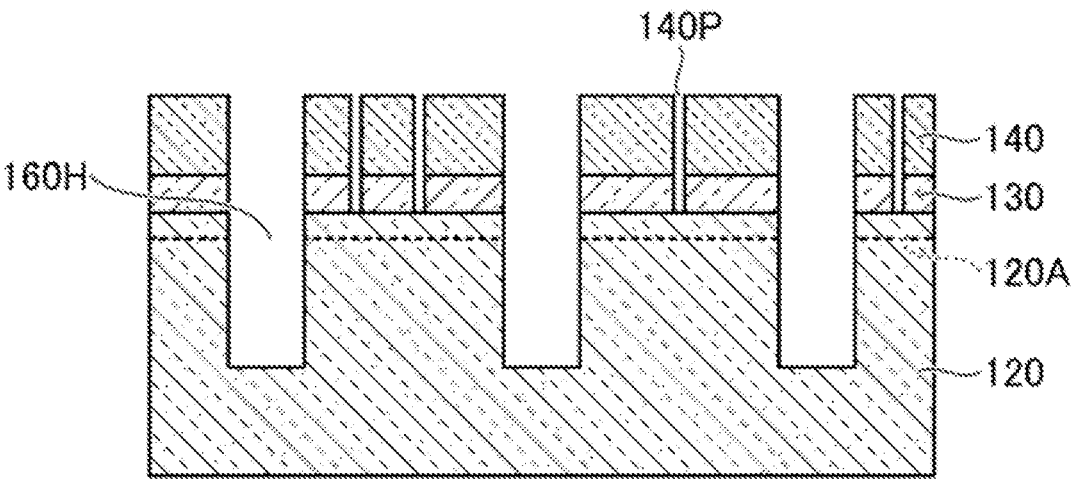
FIG. 8F is a view for describing a method for manufacturing the semiconductor device 100A of the second embodiment.
Figure 8F:
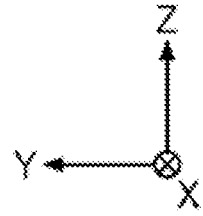

Next, a pattern of resist 10A having an opening portion 11 is formed in a portion for forming the protrusions 160S and 160D by photolithography or EB lithography. Moreover, when the electron supply layer 140, the spacer layer 130, and the electron traveling layer 120 directly below the opening portion 11 where the resist 10A does not exist are removed, the structure illustrated in FIG. 8E is obtained. Dry etching such as RIE using a chlorine-based gas is used to remove the electron supply layer 140, the spacer layer 130, and the electron traveling layer 120. An etching depth at this time is deeper than an interface between a channel and the spacer layer 130, and the depth with respect to the interface between the channel and the spacer layer 130 (the upper surface of the electron traveling layer 120) is favorably 3 nm to 20 nm, both inclusive. Thereafter, when the resist 10A is removed, the state illustrated in FIG. 8F is obtained.

Figure 8G:
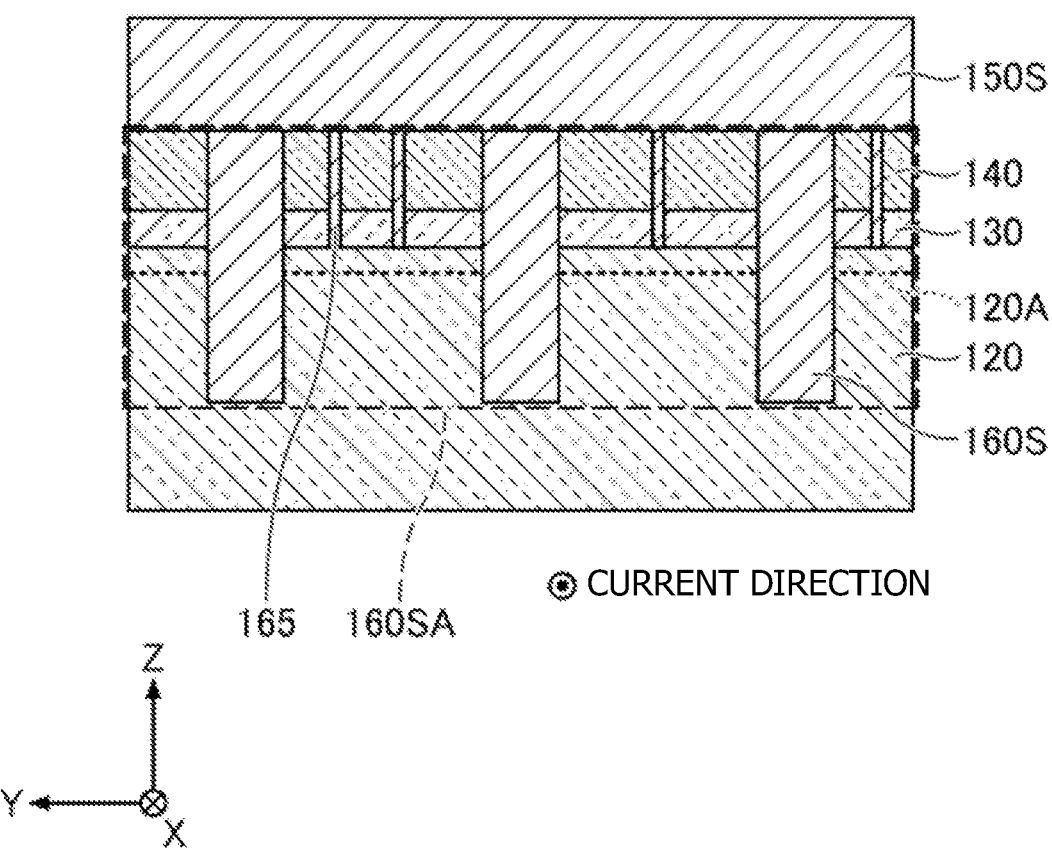
FIG. 8G is a view for describing the method for manufacturing the semiconductor device 100A of the second embodiment.

Next, a resist pattern having an opening portion is formed in an area where the source electrode 150S and the drain electrode 150D are to be formed by photolithography, and the metal is vapor-deposited by a vacuum vapor deposition method. As the metal, for example, a laminated film having Ti of 2 nm to 50 nm in the first layer and Al of 100 nm to 300 nm in the second layer may be used. Thereafter, when the metal other than the source electrode 150S and the drain electrode 150D is removed together with the resist by a lift-off technique, the structure in FIG. 8G in which the metal portion 165 is formed inside the pit 140P together with the source electrode 150S and the protrusion 160S is obtained. FIG. 8G illustrates the portion where the source electrode 150S exists in a Y direction, but the same similarly applies to the portion where the drain electrode 150D exists.

Moreover, by performing heat treatment (alloying treatment) at 500° C. to 650° C. in a nitrogen atmosphere, ohmic contact is established among the source electrode 150S and the protrusion 160S, the drain electrode 150D and the protrusion 160D, and the metal portion 165.

Thereafter, by forming a gate electrode 150G and a passivation film 170, similarly to the semiconductor device 100 of the first embodiment, the semiconductor device 100A of the second embodiment is completed. In the semiconductor device 100A, the protrusions 160S and 160D are formed in the areas 160SA and 160DA, respectively, as in the semiconductor device 100 of the first embodiment, and the metal portion 165 is formed inside the spacer layer 130 and the electron supply layer 140 of the nitride semiconductor layers inside the areas 160SA and 160DA.

In the nitride semiconductor layers provided with the metal portion 165 inside the areas 160SA and 160DA, the ratio of the metal portion 165 is adjusted such that the elements constituting the nitride semiconductor layers occupy 80% or more in volume ratio.

Therefore, the semiconductor device 100A capable of further reducing the contact resistance by the protrusions 160S and 160D and the metal portion 165, and the method for manufacturing the semiconductor device 100A can be provided.

Third Embodiment

Figure 9A:
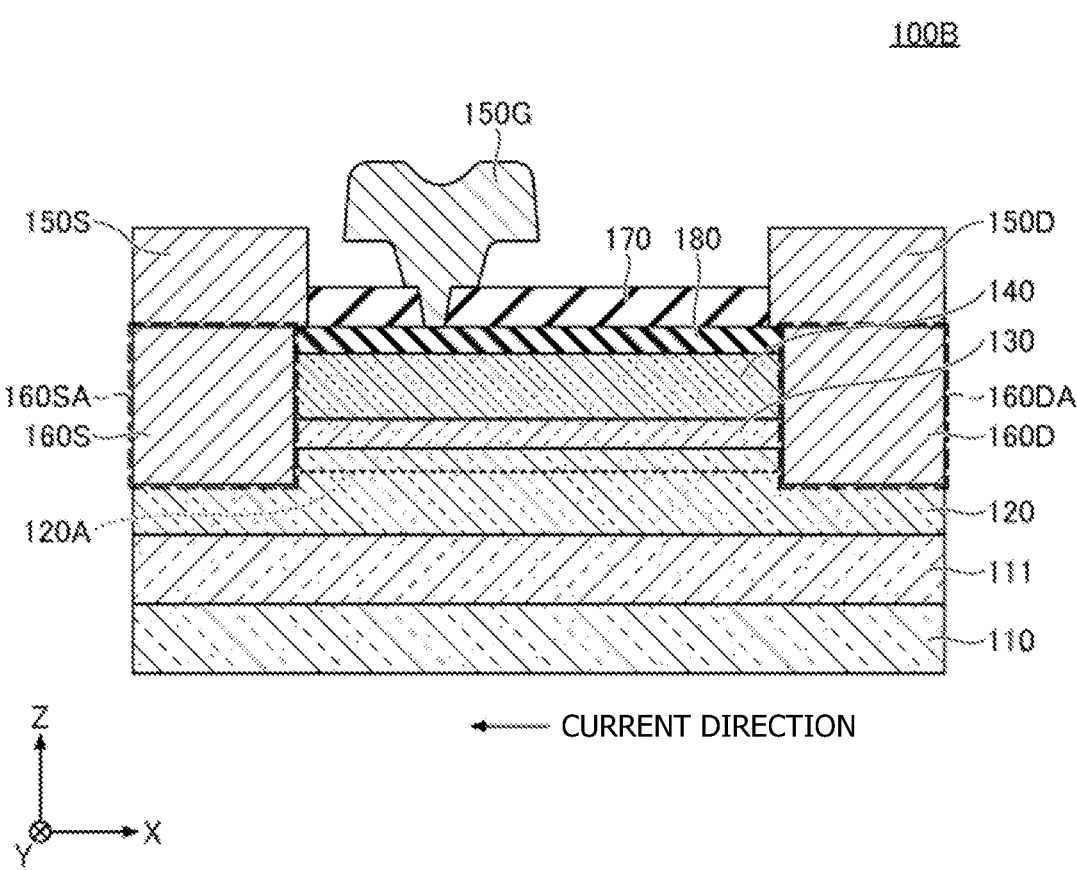
FIG. 9A is a view illustrating a cross-sectional structure of a semiconductor device 100B of a third embodiment.
Figure 9B:
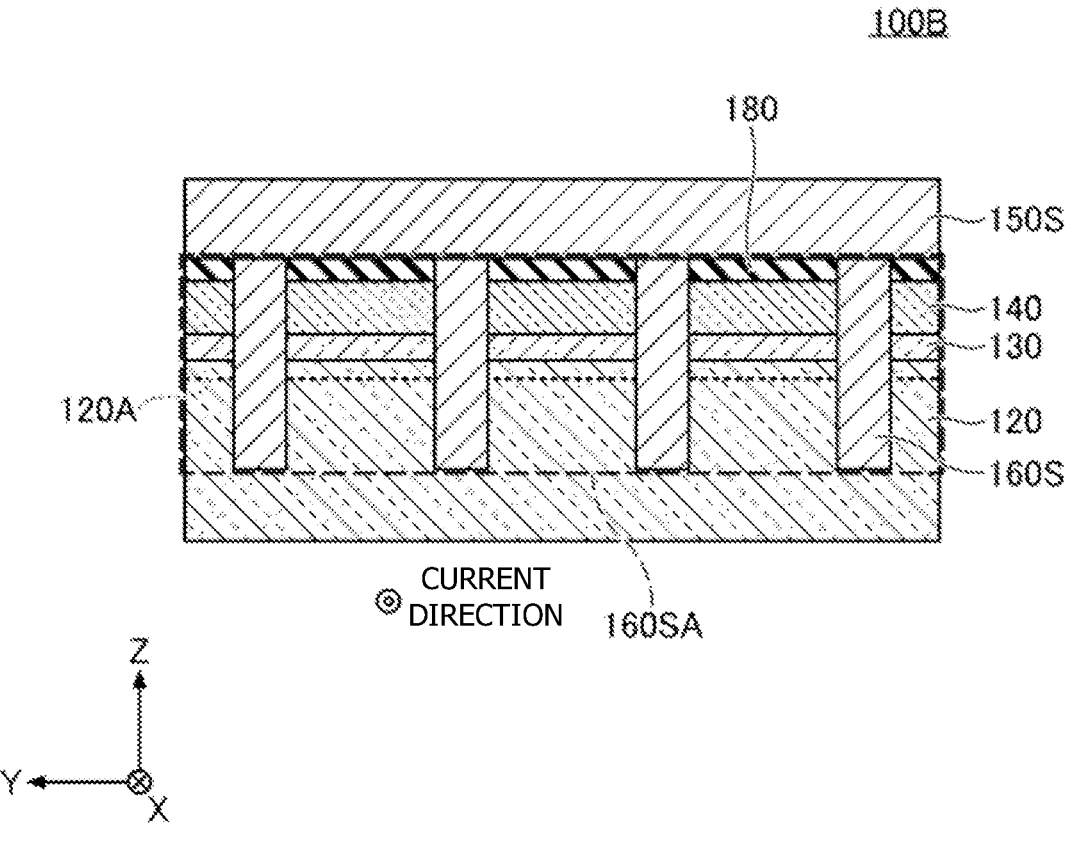
FIG. 9B is a view illustrating a cross-sectional structure of the semiconductor device 100B of the third embodiment.

FIGS. 9A and 9B are views illustrating cross-sectional structures of a semiconductor device 100B of a third embodiment. The cross section illustrated in FIG. 9A corresponds to the cross section illustrated in FIG. 1A of the first embodiment, and the cross section illustrated in FIG. 9B corresponds to the cross section illustrated in FIG. 2B.

The semiconductor device 100B has a configuration in which a cap layer 180 is added between the upper surface of the electron supply layer 140, and the gate electrode 150G, the source electrode 150S, and the drain electrode 150D of the semiconductor device 100 of the first embodiment. Hereinafter, differences from the semiconductor device 100 of the first embodiment will be mainly described.

The cap layer 180 is an example of a sheet resistance reduction layer provided at an interface between the electron supply layer 140, and the source electrode 150S and the drain electrode 150D, and which reduces a sheet resistance Rsh of a 2DEG 120A.

The cap layer 180 can be formed of, for example, GaN, and is, for example, a nitride semiconductor layer (GaN cap layer) that can be fabricated by MOCVD after the process of FIG. 7B in the method for manufacturing the semiconductor device 100 of the first embodiment. Such a cap layer 180 is also provided in an area 160SA as illustrated in FIG. 9B. Furthermore, the cap layer 180 is similarly provided in an area 160DA as well. By adding the cap layer 180 to the nitride semiconductor layers in the areas 160SA and 160DA, density of the 2DEG 120A can be further increased and the sheet resistance Rsh of an electron traveling layer 120 can be reduced.

Therefore, according to the third embodiment, the semiconductor device 100B capable of reducing a contact resistance Rc by the protrusions 160S and 160D and capable of reducing the sheet resistance Rsh by the cap layer 180, and the method for manufacturing the semiconductor device 100B can be provided.

Fourth Embodiment

Figure 10A:
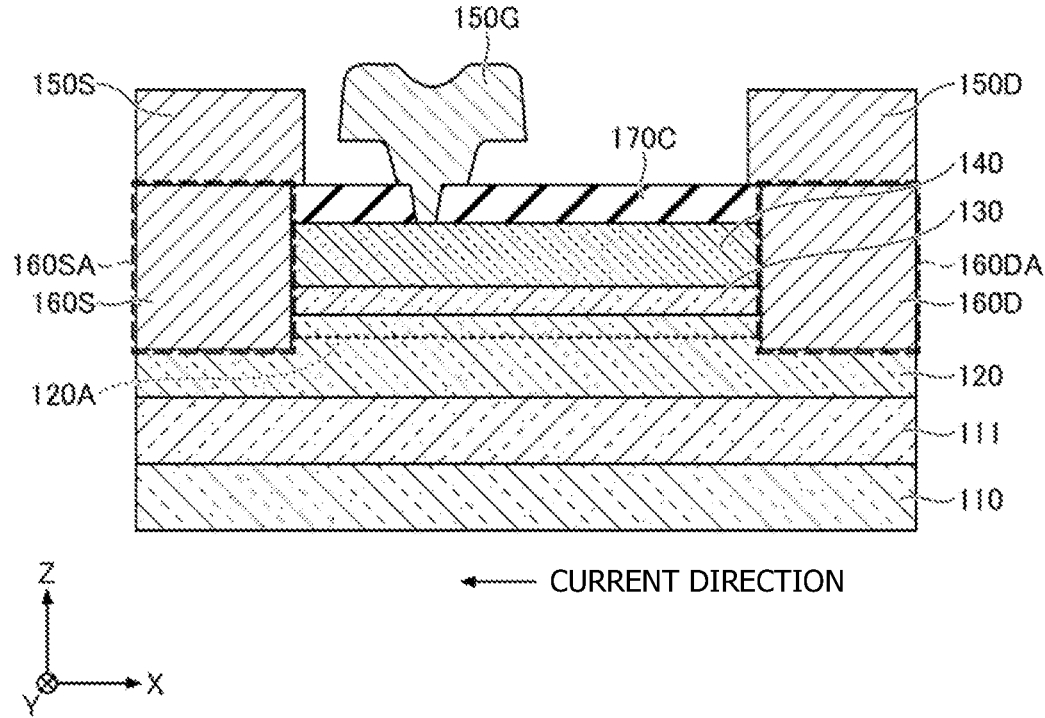
FIG. 10A is a view illustrating a cross-sectional structure of a semiconductor device 100C of a fourth embodiment.
Figure 10B:
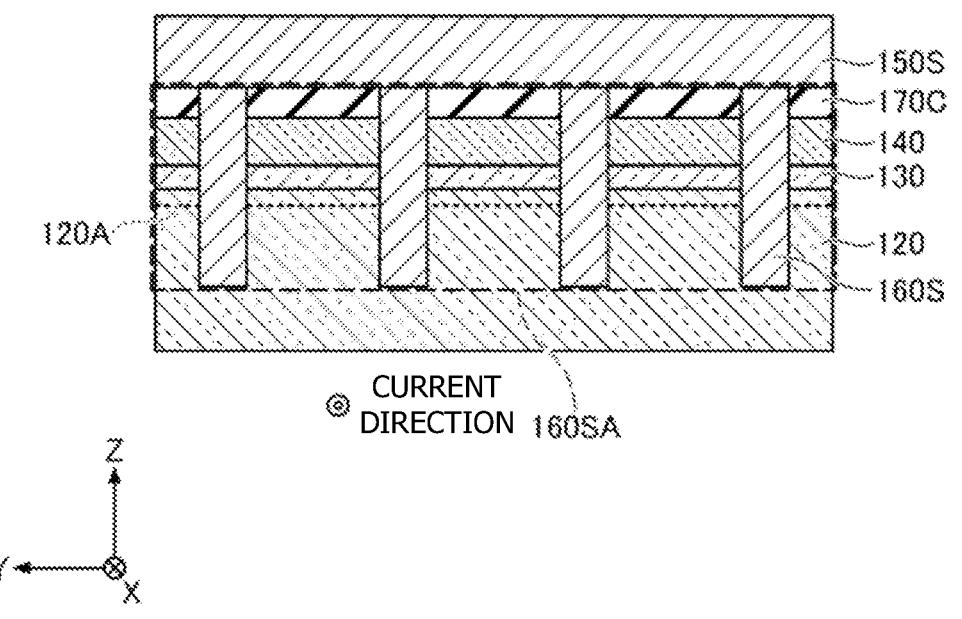
FIG. 10B is a view illustrating a cross-sectional structure of a part of the semiconductor device 100C.

FIG. 10A is a view illustrating a cross-sectional structure of a semiconductor device 100C of a fourth embodiment. FIG. 10B is a view illustrating a cross-sectional structure of a part of the semiconductor device 100C. The cross section illustrated in FIG. 10A corresponds to the cross section illustrated in FIG. 1A of the first embodiment, and the cross section illustrated in FIG. 10B corresponds to the cross section illustrated in FIG. 2B.

Configuration of Semiconductor Device 100C

A semiconductor device 100C has a configuration including a passivation film 170C instead of the passivation film 170 of the semiconductor device 100 of the first embodiment. Hereinafter, differences from the semiconductor device 100 of the first embodiment will be mainly described.

The passivation film 170C is an example of a sheet resistance reduction layer provided at an interface between an electron supply layer 140, and a source electrode 150S and a drain electrode 150D, and which reduces a sheet resistance Rsh of a 2DEG 120A, as in the cap layer 180 of the semiconductor device 100B of the third embodiment.

Method for Manufacturing Semiconductor Device 100C

FIGS. 10C to 10J are views for describing a method for manufacturing the semiconductor device 100C of the fourth embodiment. A process of epitaxially growing an initial layer 111, an electron traveling layer 120, a spacer layer 130, and the electron supply layer 140 on a substrate 110 by MOCVD and an element separation process are similar to the method for manufacturing the semiconductor device 100 of the first embodiment, and thus description is omitted here.

Figure 10C:
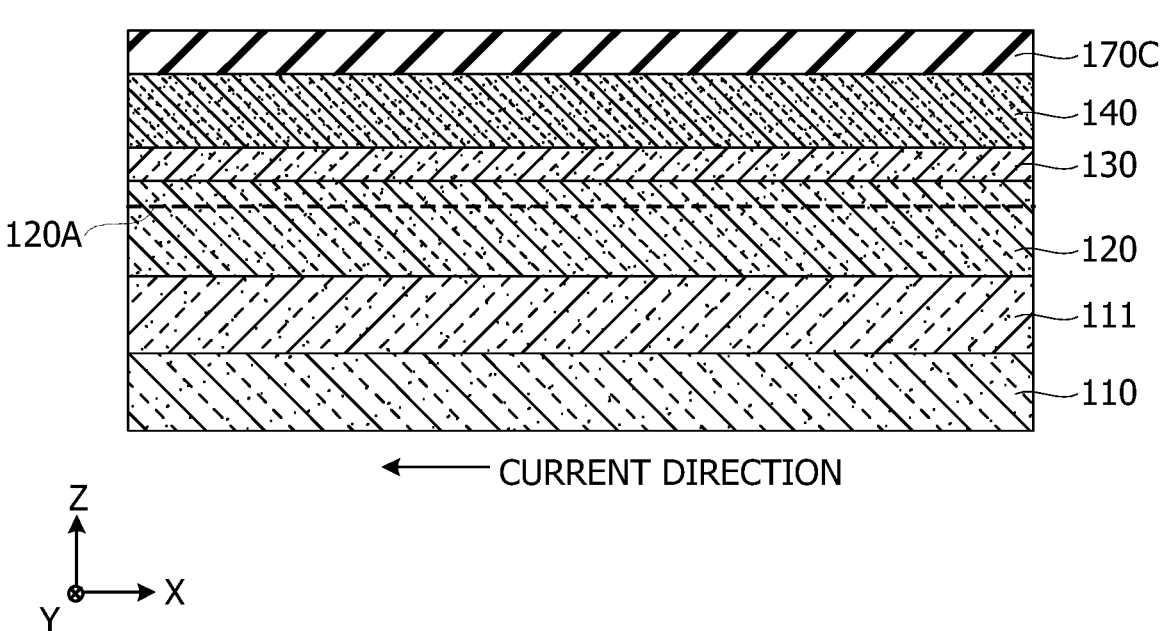
FIG. 10C is a view for describing a method for manufacturing the semiconductor device 100C of the fourth embodiment.
Figure 10D:
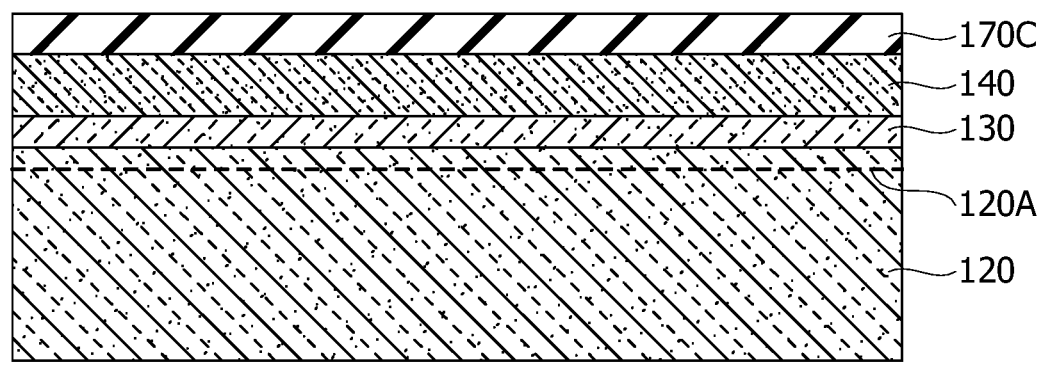
FIG. 10D is a view for describing the method for manu-facturing the semiconductor device 100C of the fourth embodiment.
Figure 10D:
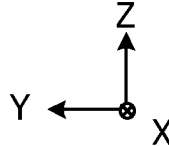

Next, as illustrated in FIGS. 10C and 10D, an insulating film to be the passivation film 170C is formed on the electron supply layer 140 by plasma CVD. The insulating film is formed of SiN or the like, and a film thickness is between 2 nm and 100 nm, for example, 50 nm. Note that the insulating film may be formed by ALD or sputtering. Furthermore, the insulating film may be formed of an oxide such as Si, Al, Hf, Zr, or Ta other than SiN, a nitride, an oxynitride, or a laminated film thereof. Furthermore, at this stage, heat treatment may be performed at 650° C. or lower in order to reduce the sheet resistance Rsh of the electron traveling layer 120.

Figure 10E:
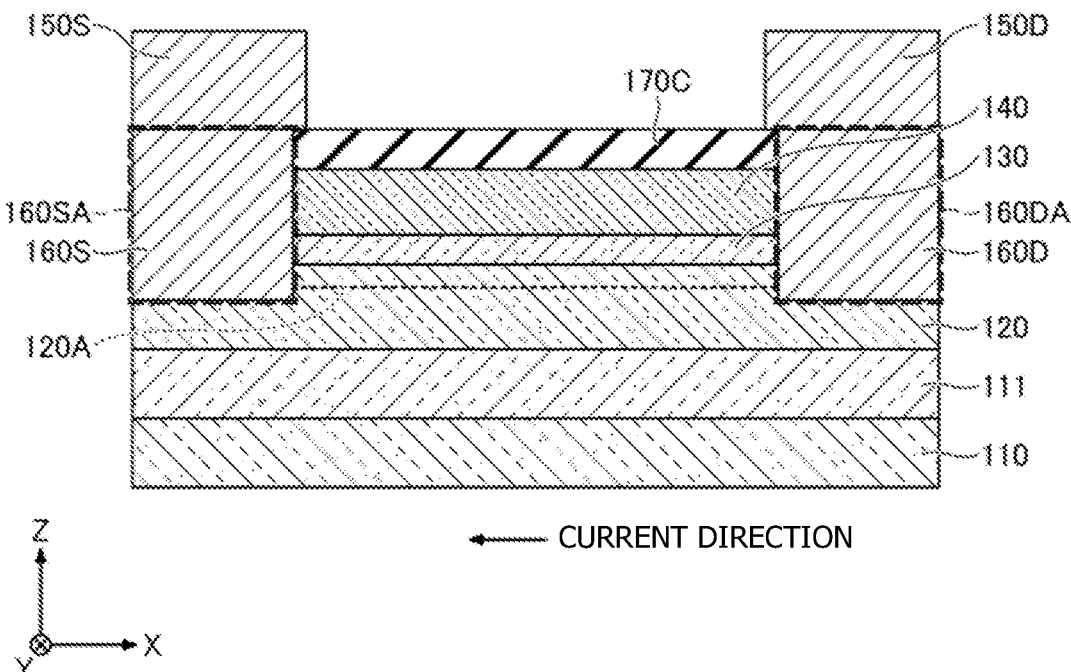
FIG. 10E is a view for describing the method for manu-facturing the semiconductor device 100C of the fourth embodiment.
Figure 10F:
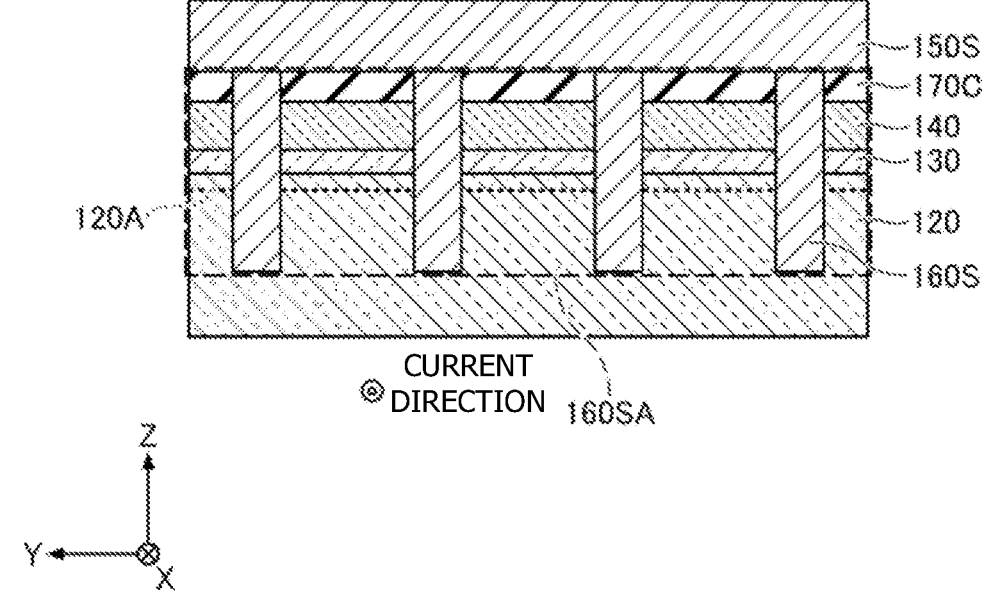
FIG. 10F is a view for describing the method for manu-facturing the semiconductor device 100C of the fourth embodiment.
Figure 10G:
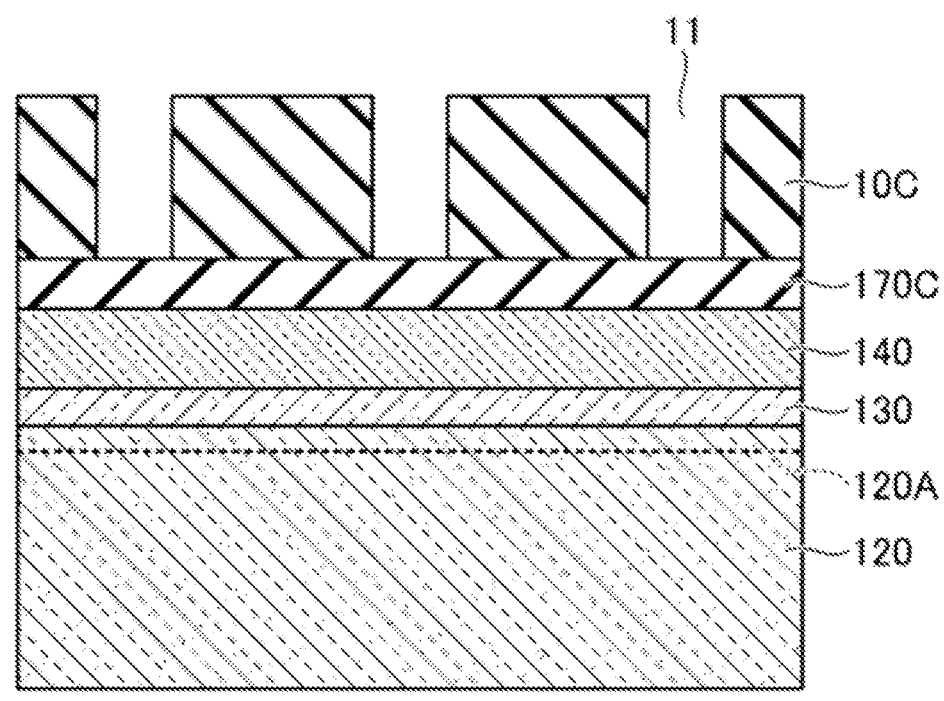
FIG. 10G is a view for describing the method for manu-facturing the semiconductor device 100C of the fourth embodiment.
Figure 10G:
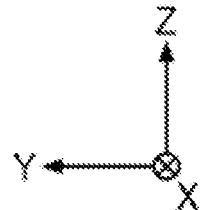
Figure 10H:
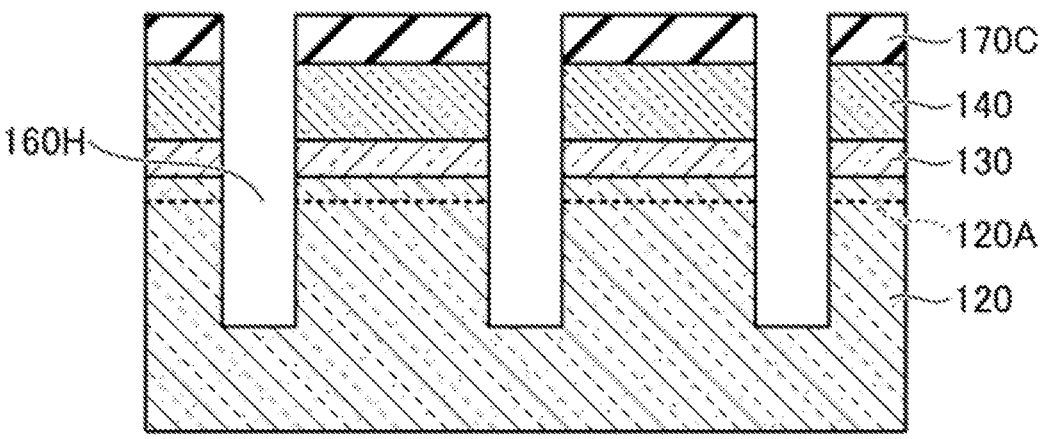
FIG. 10H is a view for describing the method for manu-facturing the semiconductor device 100C of the fourth embodiment.
Figure 10H:
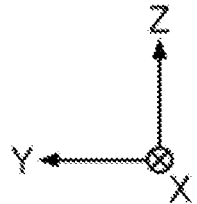
Figure 10I:
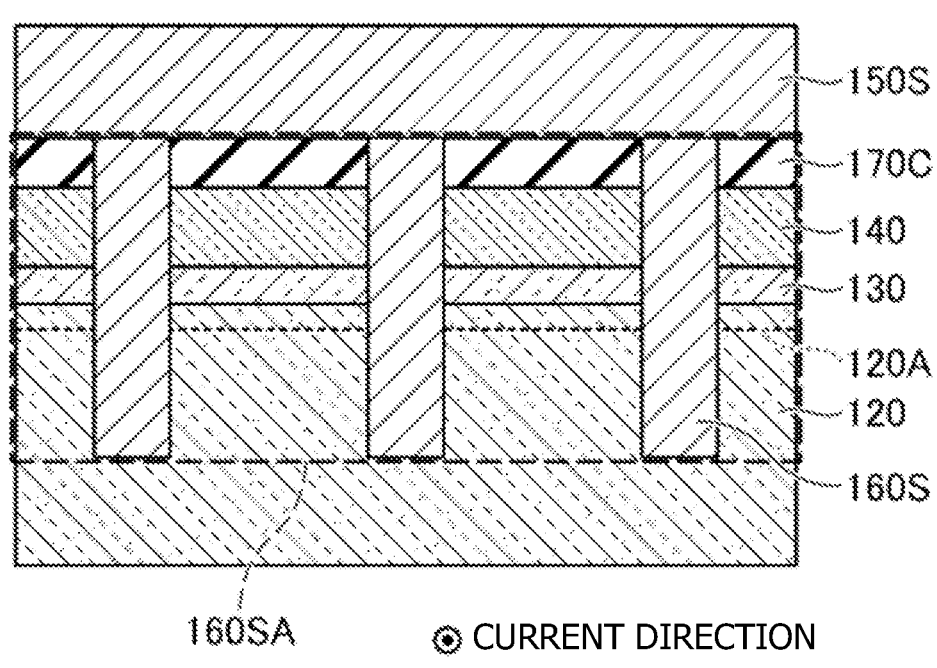
FIG. 10I is a view for describing the method for manu-facturing the semiconductor device 100C of the fourth embodiment.
Figure 10I:
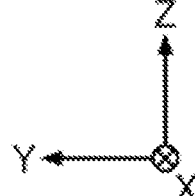

Next, as illustrated in FIGS. 10E and 10F, protrusions 160S and 160D, the source electrode 150S, and the drain electrode 150D are formed. For example, description will be given with reference to FIGS. 10G to 10I. FIGS. 10G to 10I illustrate portions corresponding to the source electrode 150S and the protrusion 160S, but the same similarly applies to portions corresponding to the drain electrode 150D and the protrusion 160S. Therefore, the portions corresponding to the source electrode 150S and the protrusion 160S and the portions corresponding to the drain electrode 150D and the protrusion 160S will be described.

As illustrated in FIG. 10G, a pattern of a resist 10C having an opening portion 11 is formed in a portion for forming the protrusions 160S and 160D by photolithography or EB lithography.

Next, the passivation film 170C in an area directly below the opening portion 11 in which the resist 10C does not exist is removed. For example, in a case of using SiN for the passivation film 170C, dry etching such as RIE using a fluorine-based gas is used. Next, the electron supply layer 140, the spacer layer 130, and the electron traveling layer 120 in an area where the resist 10C and the passivation film 170C do not exist are removed. For the removal, dry etching such as RIE using a chlorine-based gas is used. An etching depth at this time is deeper than an interface between a channel and the spacer layer 130, and the depth with respect to the interface between the channel and the spacer layer 130 (the upper surface of the electron traveling layer 120) is favorably 3 nm to 20 nm, both inclusive. Thereafter, when the remaining resist 10C is removed, the state illustrated in FIG. 10H is obtained.

Next, a resist pattern having an opening is formed in an area where the source electrode 150S and the drain electrode 150D are to be formed by photolithography, and metal for forming the source electrode 150S and the drain electrode 150D is vapor-deposited by a vacuum vapor deposition method. As the metal, for example, a laminated film having Ti of 2 nm to 50 nm in the first layer and Al of 100 nm to 300 nm in the second layer may be used. Thereafter, when the metal other than the source electrode 150S and the drain electrode 150D is removed by a lift-off technique, the structure illustrated in FIG. 10I is obtained. FIG. 10I illustrates the portion where the source electrode 150S exists in the Y direction, but the same similarly applies to the portion where the drain electrode 150D exists.

Moreover, by performing heat treatment (alloying treatment) at 500° C. to 650° C. in a nitrogen atmosphere, ohmic contact is established between the source electrode 150S and the protrusion 160S, and the drain electrode 150D and the protrusion 160D.

Thereafter, a resist pattern having an opening portion is formed on the passivation film 170C in an area where a gate electrode 150G is to be formed, and the metal is vapor-deposited by a vacuum vapor deposition method. As the metal, for example, a laminated film having Ni of 5 nm to 30 nm in the first layer and Au of 100 nm to 300 nm in the second layer can be formed. Then, the metals other than the gate electrode 150G are removed together with the resist by lift-off. Through the above processes, the semiconductor device 100D of the fourth embodiment illustrated in FIG. 10A is completed.

In the semiconductor device 100C, the passivation film 170C is provided between the electron supply layer 140, and the source electrode 150S and the drain electrode 150D in the areas 160SA and 160DA, so that density of the 2DEG 120A is further increased and the sheet resistance Rsh of the electron traveling layer 120 can be reduced.

Therefore, according to the fourth embodiment, the semiconductor device 100C capable of reducing the contact resistance Rc by the protrusions 160S and 160D and capable of reducing the sheet resistance Rsh by the passivation film 170C, and the method for manufacturing the semiconductor device 100C can be provided.

Fifth Embodiment

Figure 11A:
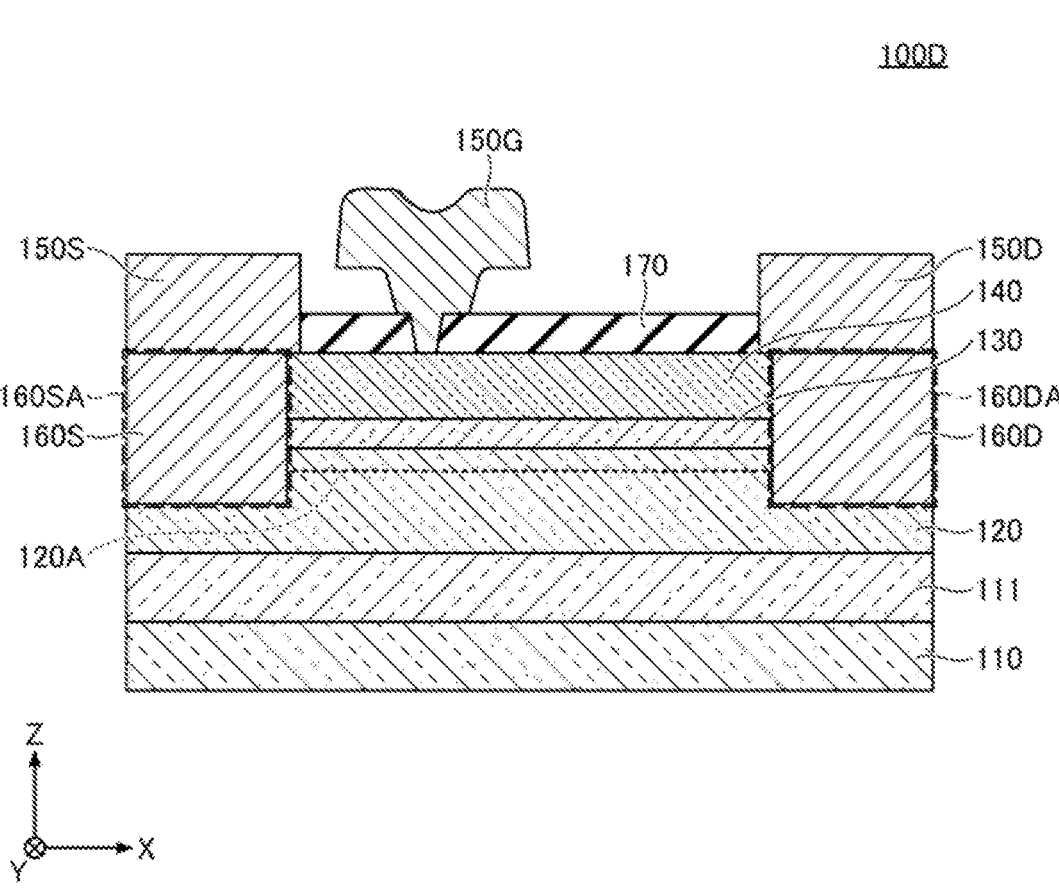
FIG. 11A is a view illustrating a cross-sectional structure of a semiconductor device 100D of a fifth embodiment.
Figure 11B:
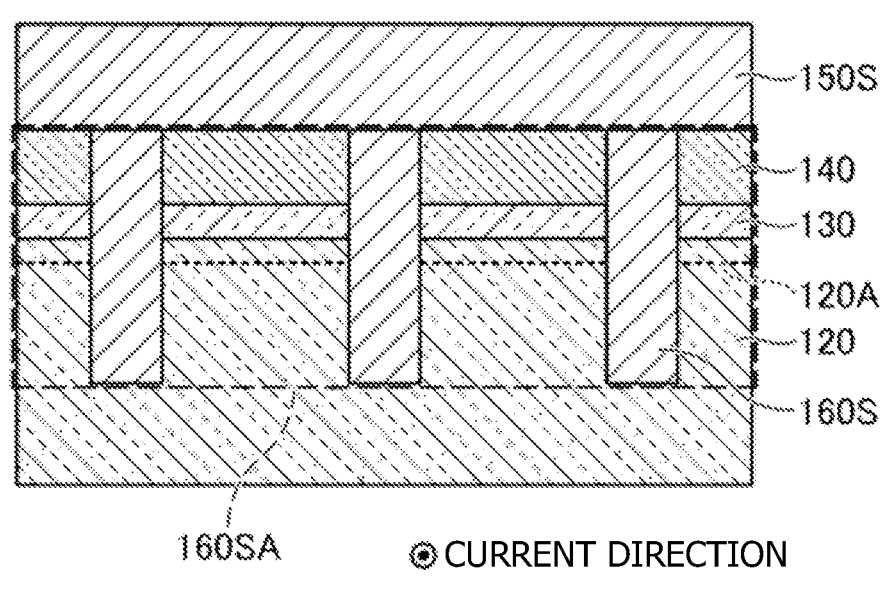
FIG. 11B is a view illustrating a cross-sectional structure of a part of the semiconductor device 100D.
Figure 11B:
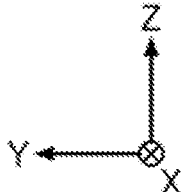
Figure 11C:
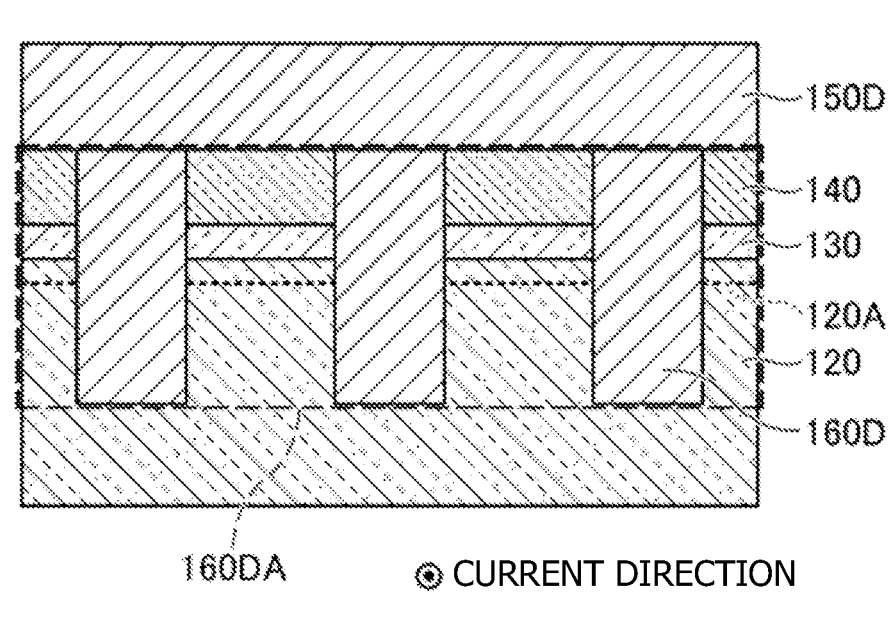
FIG. 11C is a view illustrating a cross-sectional structure of a part of the semiconductor device 100D.
Figure 11C:
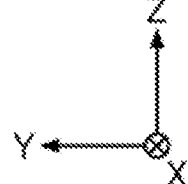

FIG. 11A is a view illustrating a cross-sectional structure of a semiconductor device 100D of a fifth embodiment. FIGS. 11B and 11C are views illustrating cross-sectional structures of a part of the semiconductor device 100D. The cross section illustrated in FIG. 11A corresponds to the cross section illustrated in FIG. 1A of the first embodiment, and the cross section illustrated in FIG. 11B is a cross section including a source electrode 150S corresponding to the cross section illustrated in FIG. 2B. Furthermore, FIG. 11C illustrates a cross section including a drain electrode 150D corresponding to the cross section illustrated in FIG. 11B. Hereinafter, differences from the semiconductor device 100 of the first embodiment will be mainly described.

As illustrated in FIG. 11A, the cross-sectional structure of the semiconductor device 100D in an XZ plane is similar to that of the semiconductor device 100 of the first embodiment illustrated in FIG. 1A. Furthermore, as illustrated in FIG. 11B, the cross section of a YZ plane including the source electrode 150S is similar to that of the semiconductor device 100 of the first embodiment illustrated in FIG. 2B.

In the semiconductor device 100D, as illustrated in FIG. 11C, a width in the Y direction of a protrusion 160D is set wider than a width in the Y direction of a protrusion 160S illustrated in FIG. 11B. Since lengths in an X direction of the protrusions 160S and 160D are equal, a volume ratio of the protrusion 160D in an area 160DA is larger than a volume ratio of the protrusion 160S in an area 160SA. As an example, the volume ratio of the protrusion 160S in the area 160SA is 50% or less, and the volume ratio of the protrusion 160D in the area 160DA is higher than 50% and 60% or less.

By setting such a volume ratio relationship, a contact resistance Rc of the source electrode 150S becomes lower than a contact resistance Rc of the drain electrode 150D. This is because the protrusion 160S is smaller than the protrusion 160D, and resistance components with a low 2DEG 120A are larger in the area 160SA than in the area 160DA.

By keeping the contact resistance Rc of the source electrode 150S low, mutual conductance is improved and high frequency amplification capability can be improved. Furthermore, by relatively increasing the contact resistance Rc of the drain electrode 150D, voltage drop in the drain electrode 150D becomes large, and it becomes possible to alleviate electric field concentration in an end portion on a drain electrode 150D side, of a gate electrode 150G. Thereby, this contributes to higher withstand voltage and lower current collapse, leading to improvement in output power of the semiconductor device 100D. This is particularly useful in a case of using the semiconductor device 100D as a power amplifier.

The semiconductor device and the method for manufacturing the semiconductor device according to the exemplary embodiments of the present disclosure have been described. However, the present disclosure is not limited to the embodiments disclosed in detail, and the various changes and alterations could be made hereto without departing from the scope of claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
a substrate;
an electron traveling layer provided above the substrate;
an electron supply layer provided above the electron traveling layer;
a gate electrode, a source electrode, and a drain electrode provided above the electron supply layer;
a plurality of first protrusions that extend from a lower end of the source electrode through an inside of the electron supply layer to below an upper surface of the electron traveling layer, and that are formed of electrode material of the source electrode; and a plurality of second protrusions that extend from a lower end of the drain electrode through the inside of the electron supply layer to below the upper surface of the electron traveling layer, and that are formed of electrode material of the drain electrode, wherein
the plurality of first protrusions extend in a first direction from the source electrode to the drain electrode and are arranged at predetermined intervals in a second direction perpendicular to the first direction,
the plurality of second protrusions extend in the first direction and are arranged at predetermined intervals in the second direction, and
a first volume ratio of the plurality of first protrusions in a first area where the plurality of first protrusions is provided is 60% or less, and a second volume ratio of the plurality of second protrusions in a second area where the plurality of second protrusions is provided is 60% or less.

2. The semiconductor device according to claim 1, wherein
the plurality of first protrusions is a plurality of thin plate-shaped protrusions that extend along the first direction that connects the source electrode and the drain electrode in plan view and that are arrayed in the second direction which intersects the first direction in plan view, and
the plurality of second protrusions is a plurality of thin plate-shaped protrusions that extend along the first direction and that are arrayed in the second direction.

3. The semiconductor device according to claim 2, wherein
an end portion on a drain electrode side in the first direction, of the plurality of first protrusions, is offset in a direction away from the drain electrode with respect to an end portion on the drain electrode side in the first direction, of the source electrode, and
an end portion on a source electrode side in the first direction, of the plurality of second protrusions, is offset in a direction away from the source electrode with respect to an end portion on the source electrode side in the first direction, of the drain electrode.

4. The semiconductor device according to claim 3, wherein
an offset amount in the first direction of the plurality of first protrusions is 0 $\mu$m to 0.25 $\mu$m, both inclusive, and
an offset amount in the first direction of the plurality of second protrusions is 0 $\mu$m to 0.25 $\mu$m, both inclusive.

5. The semiconductor device according to claim 2, wherein
a bottom surface of the plurality of first protrusions is located at a position of 3 nm to 20 nm, both inclusive, in a depth direction from the upper surface of the electron traveling layer, and
a bottom surface of the plurality of second protrusions is located at a position of 3 nm to 20 nm, both inclusive, in the depth direction from the upper surface of the electron traveling layer.

6. The semiconductor device according to claim 2, wherein density in the second direction of the plurality of first protrusions in the first area and density in the second direction of the plurality of second protrusions in the second area are 0.2 $\mu$m$^{-1}$ to 5.0 $\mu$m$^{-1}$, both inclusive.

7. The semiconductor device according to claim 1, wherein a semiconductor layer inside the first area or the second area of the electron supply layer or the electron traveling layer has a pit in which metal is embedded, and an element which constitutes the semiconductor layer occupies 80% or more in the semiconductor layer.

8. The semiconductor device according to claim 1, wherein the first volume ratio and the second volume ratio are different.

9. The semiconductor device according to claim 8, wherein the first volume ratio is 50% or less, and the second volume ratio is higher than 50% and 60% or less.

10. The semiconductor device according to claim 2, wherein the first volume ratio is 50% or less, and the second volume ratio is higher than 50% and 60% or less, lengths in the first direction of the first protrusion and the second protrusion are equal, and a width in the second direction of the second protrusion is wider than a width in the second direction of the first protrusion.

11. A method for manufacturing a semiconductor device comprising:

a substrate;

forming an electron traveling layer above the substrate;

forming an electron supply layer above the electron traveling layer;

forming, in a first plane area where a source electrode is formed above the electron supply layer, a plurality of first protrusions that extend through an inside of the electron supply layer to below an upper surface of the electron traveling layer with electrode material of the source electrode;

forming, in a second plane area where a drain electrode is formed above the electron supply layer, a plurality of second protrusions that extend through the inside of the electron supply layer to below the upper surface of the electron traveling layer with electrode material of the drain electrode;

forming the source electrode and the drain electrode respectively connected to the plurality of first protrusions and the plurality of second protrusions above the electron supply layer; and forming a gate electrode above the electron supply layer, wherein the plurality of first protrusions extend in a first direction from the source electrode to the drain electrode and are arranged at predetermined intervals in a second direction perpendicular to the first direction, the plurality of second protrusions extend in the first direction and are arranged at predetermined intervals in the second direction, and a first volume ratio of the plurality of first protrusions in a first area where the plurality of first protrusions is provided is 60% or less, and a second volume ratio of the plurality of second protrusions in a second area where the plurality of second protrusions is provided is 60% or less.

\* \* \* \* \*